United States Patent
Lizotte et al.

(10) Patent No.: US 8,121,155 B2
(45) Date of Patent: Feb. 21, 2012

(54) FIBER LASER BASED PRODUCTION OF LASER DRILLED MICROVIAS FOR MULTI-LAYER DRILLING, DICING, TRIMMING OR MILLING APPLICATIONS

(75) Inventors: Todd E. Lizotte, Hooksett, NH (US);
Orest Ohar, Hooksett, NH (US)

(73) Assignee: Hitachi Via Mechanics, Ltd., Kanagawa (JP)

( * ) Notice: Subject to any disclaimer, the term of this patent is extended or adjusted under 35 U.S.C. 154(b) by 164 days.

(21) Appl. No.: 12/509,833

(22) Filed: Jul. 27, 2009

(65) Prior Publication Data
US 2010/0027570 A1 Feb. 4, 2010

Related U.S. Application Data

(62) Division of application No. 11/237,527, filed on Sep. 28, 2005, now Pat. No. 7,602,822.

(60) Provisional application No. 60/620,271, filed on Oct. 18, 2004, provisional application No. 60/613,763, filed on Sep. 28, 2004.

(51) Int. Cl.
*H01S 3/30* (2006.01)
(52) U.S. Cl. .................... 372/6; 372/22; 372/25
(58) Field of Classification Search .......... 372/6
See application file for complete search history.

(56) References Cited

U.S. PATENT DOCUMENTS

| | | | |
|---|---|---|---|
| 4,734,550 A | | 3/1988 | Imamura et al. |
| 5,046,184 A | * | 9/1991 | Chee et al. ............ 372/18 |
| 6,212,310 B1 | | 4/2001 | Waarts et al. |
| 6,590,698 B1 | | 7/2003 | Ohtsuki et al. |
| 7,924,892 B2 | * | 4/2011 | Chuang et al. ............ 372/6 |
| 2004/0160998 A1 | * | 8/2004 | Gruhlke et al. ........ 372/29.021 |
| 2005/0078353 A1 | | 4/2005 | Komine |

FOREIGN PATENT DOCUMENTS

| | | |
|---|---|---|
| EP | 1306160 | 5/2003 |
| JP | 1196548 | 8/1989 |
| JP | 9107167 | 4/1997 |

OTHER PUBLICATIONS

R. Jason Jones et al., Femtosecond Pulse Amplification by Coherent Addition in a Passive Optical Cavity, Optics Letters, vol. 25, No. 20, Oct. 15, 2002 pp. 1848-1850.

* cited by examiner

*Primary Examiner* — Jessica Stultz
*Assistant Examiner* — Xnning Niu
(74) *Attorney, Agent, or Firm* — Davis & Bujold, P.L.L.C.

(57) ABSTRACT

Fiber lasers and methods for constructing and using fiber lasers for micro-/nano-machining with output beams including stacked pulses and combinations of continuous wave, pseudo-continuous wave and pulse sequence components.

2 Claims, 29 Drawing Sheets

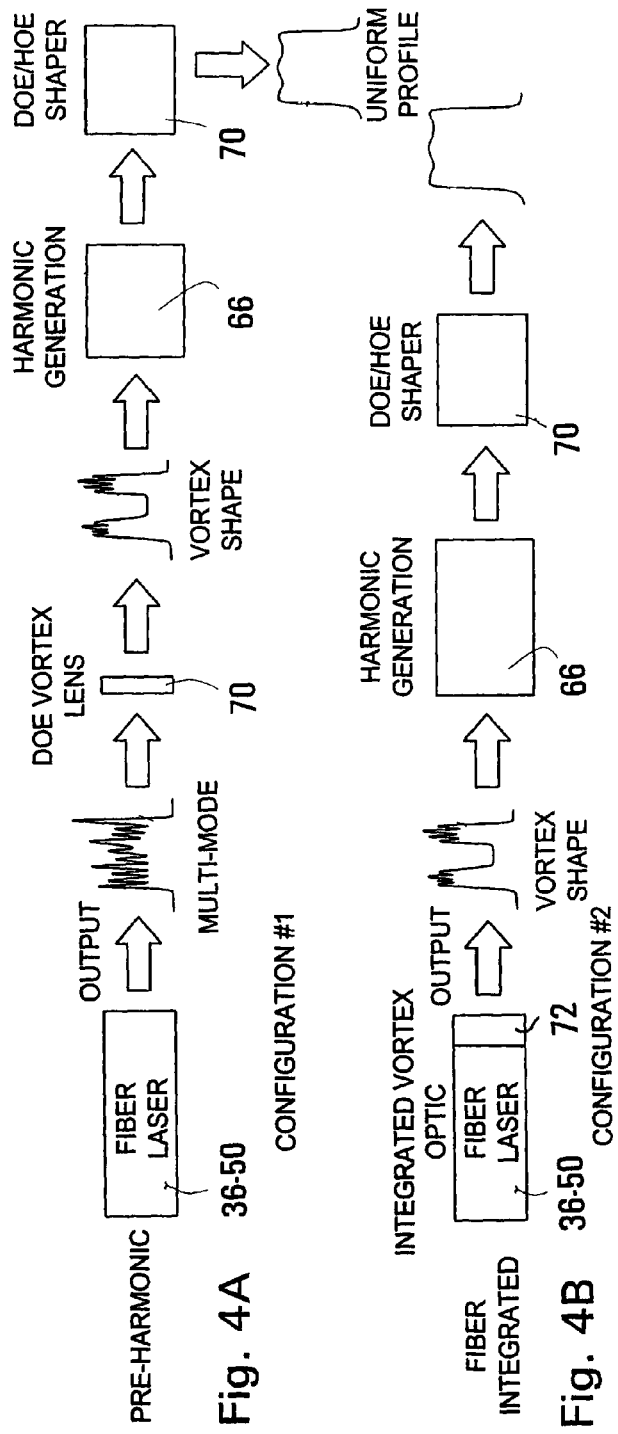

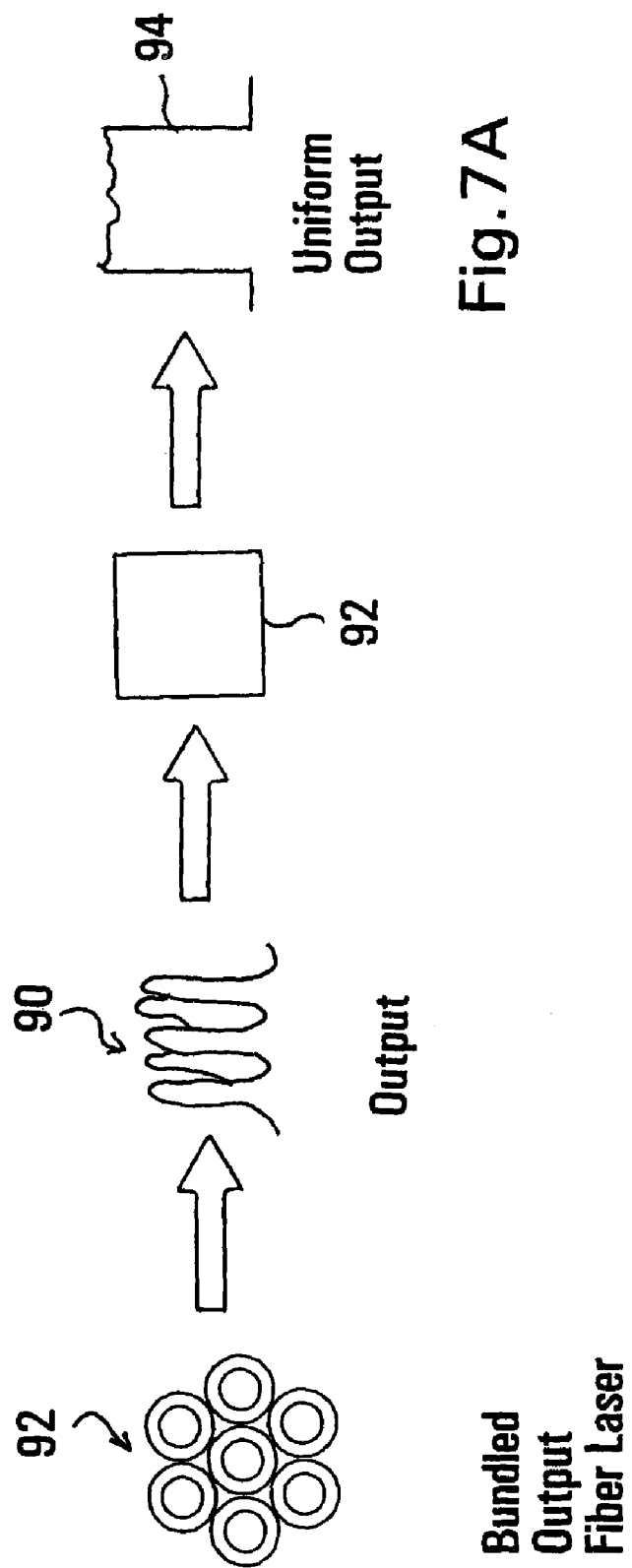

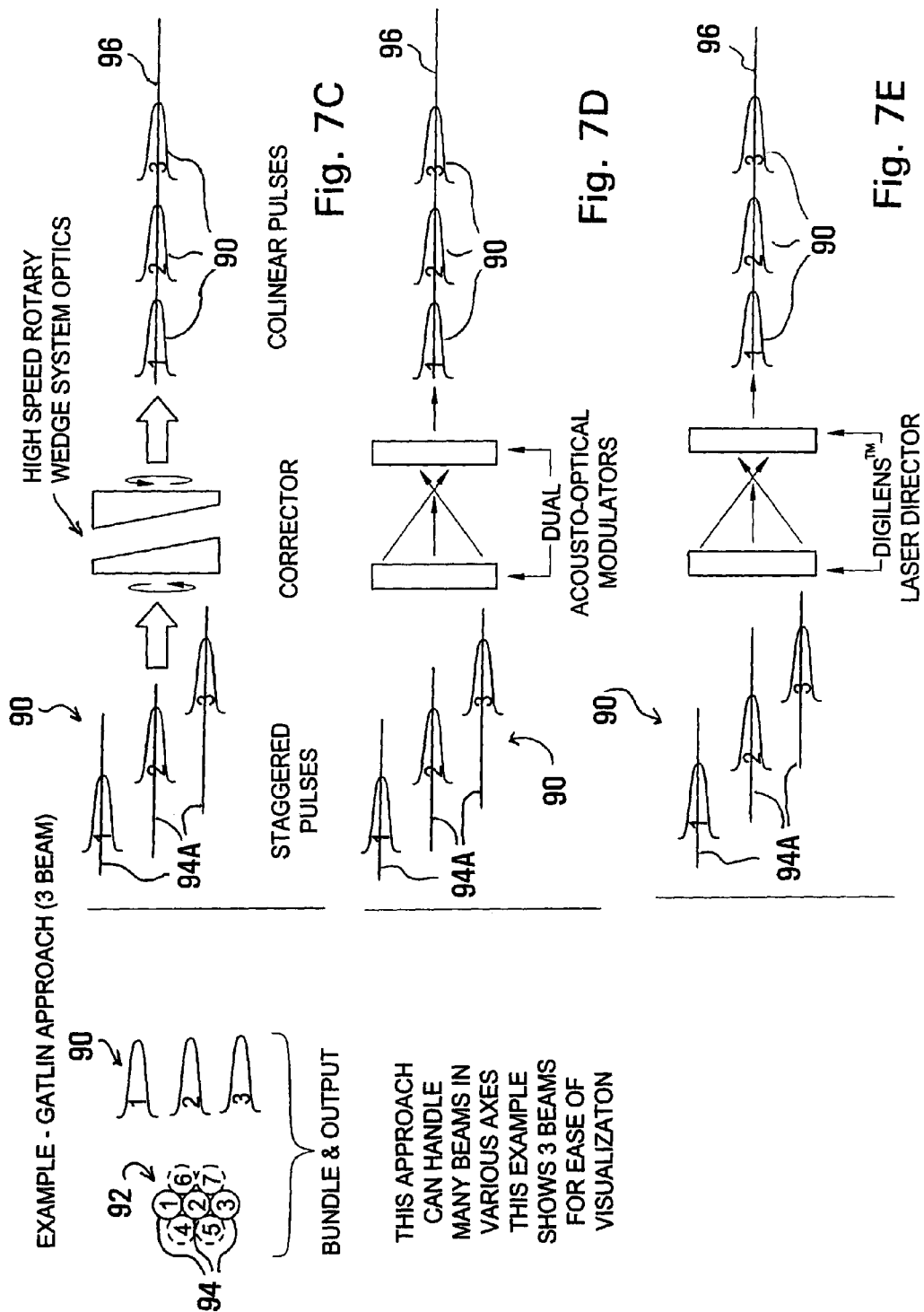

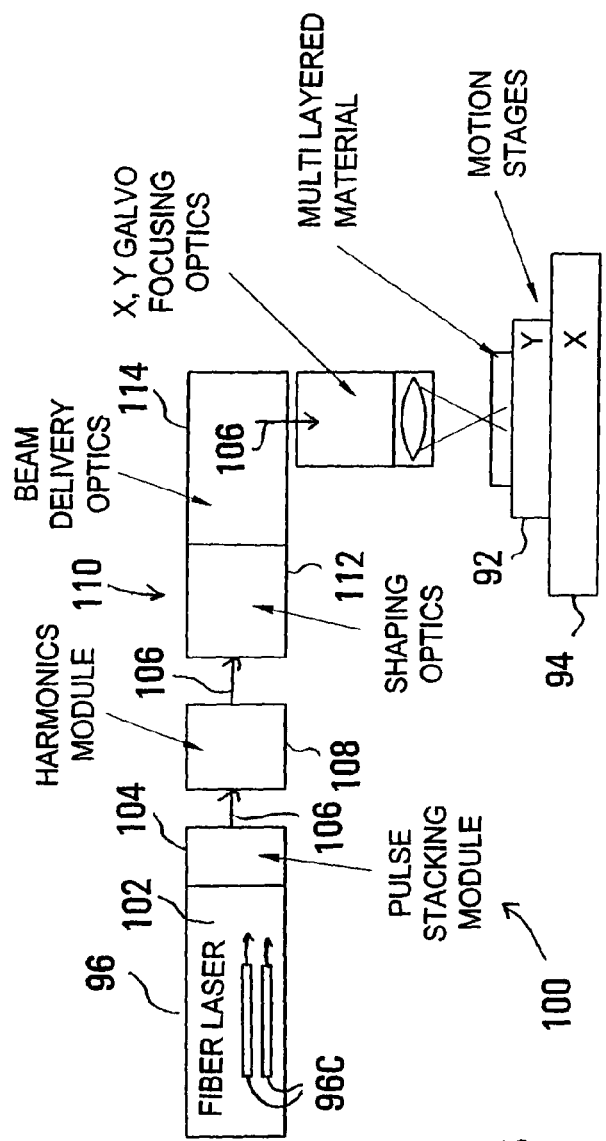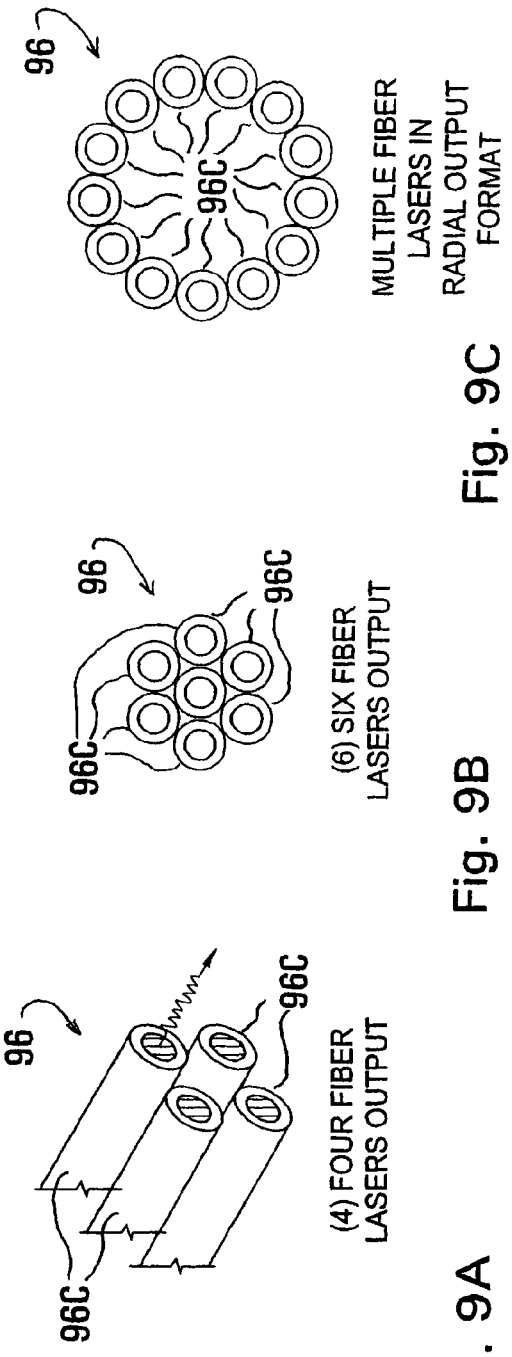

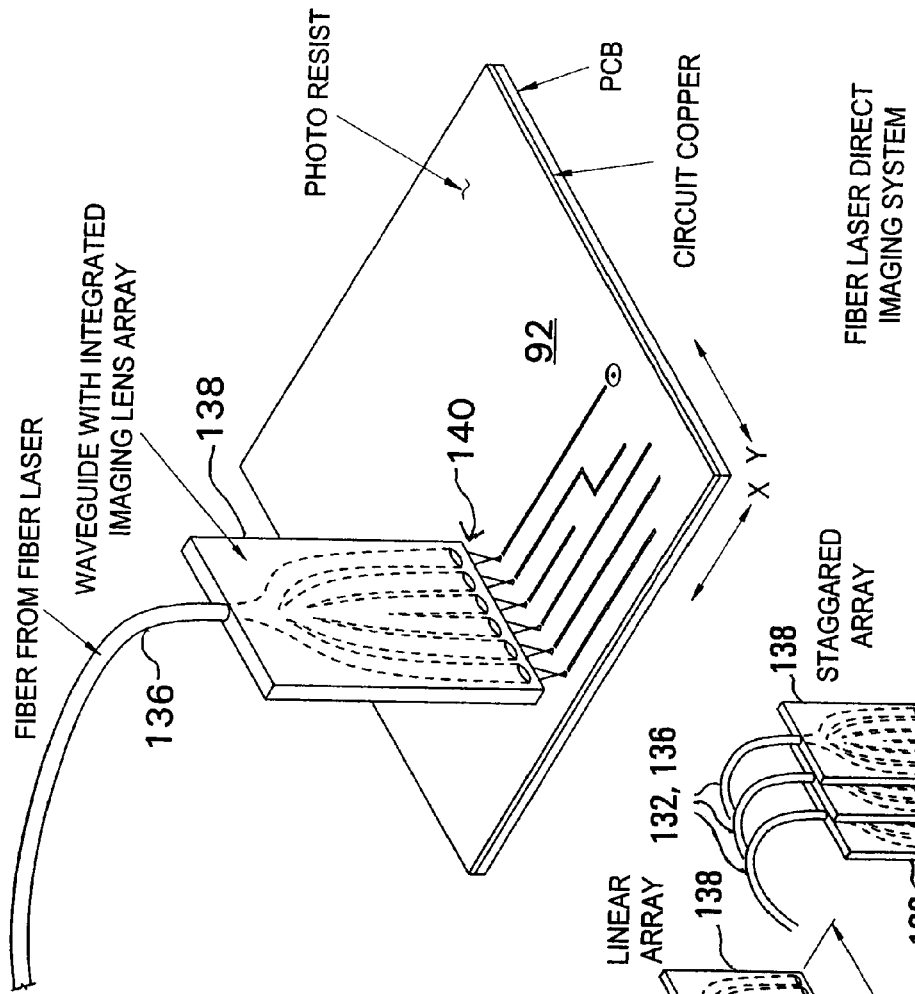
Fig. 16B
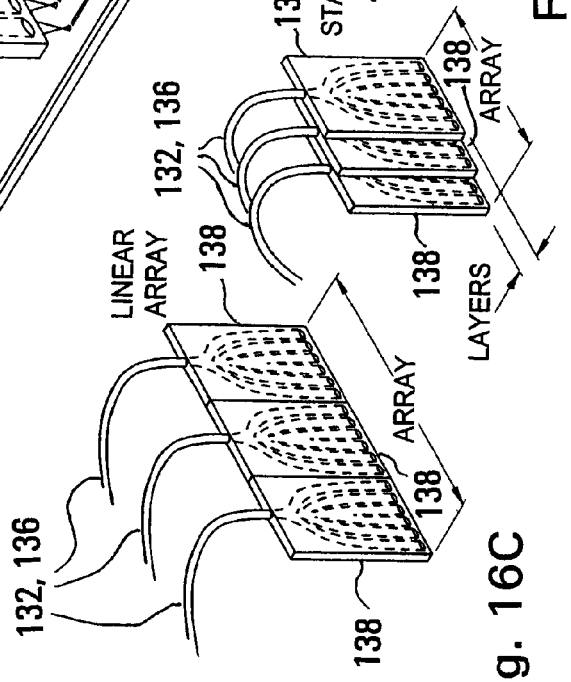
Fig. 16C
Fig. 16D

Fiber Laser Processing / Dicing Silicon

Fiber Laser Processing / Drilling Silicon

Fiber Laser Processing / Dicing Silicon

Fiber Laser Processing / Drilling Alumina Ceramic

FIBER LASER BASED PRODUCTION OF LASER DRILLED MICROVIAS FOR MULTI-LAYER DRILLING, DICING, TRIMMING OR MILLING APPLICATIONS

CROSS REFERENCE TO RELATED APPLICATIONS

The present patent application is related to and claims benefit of Provisional Patent Application Ser. No. 60/613,763 filed 28 Sep. 2004 by Todd E. Lizotte and Orest Ohar for FIBER LASER BASED PRODUCTION OF LASER DRILLED MICROVIAS FOR MULTI-LAYER DRILLING, DICING, TRIMMING OR MILLING APPLICATIONS and Provisional Patent Application Ser. No. 60/620,271 filed 18 Oct. 2004 by Todd E. Lizotte and Orest Ohar for MICRO/NANO MACHINING, WELDING, DICING, DRILLING SINGLE LAYER AND MULTIPLE LAYER MATERIALS WITH VARYING CHEMICAL COMPOSITION WITH FIBER LASERS AND FIBER LASER BEAM DELIVERY TECHNOLOGY.

FIELD OF THE INVENTION

The present invention is related to the use of fiber lasers in micro- and nano-machining of various materials and, more specifically, to methods and apparatus for generating laser beams to drive fiber lasers and to methods and apparatus using multiple fiber lasers to generate laser beams having selectable pulse width, repetition rate, frequency and power characteristics for micro- and nano-machining of various materials and multilayered materials.

BACKGROUND OF THE INVENTION

Lasers are commonly used micro- and nano-machining of a wide range of materials, such as the drilling, dicing, trimming or milling of various metals, ceramics, polymers and other materials, including the drilling, dicing and milling of printed circuit boards, substrates and integrated circuits. Such laser machining processes employ a variety of lasers to generate the machining beams, such as gas and solid state lasers, and have recently begun to use fiber optic lasers, also referred to as fiber lasers Fiber lasers offer a number of advantages in the physical construction and configuration of a laser machining system, but must typically be driven, or pumped by other lasers, such as solid state diode lasers. Fiber lasers also suffer from other problems, which are often shared with or stem from the lasers used to pump the fiber lasers.

Considering the problems arising from the lasers used to pump the fiber lasers, the Diode Pumped Solid State (DPSS) lasers currently and commonly used to drive fiber lasers produce a single mode beam and typically suffer from pointing and drift instabilities as well as from limits on the power that can be delivered by the DPSS laser, which is typically in the range of 10 Watts @ 355 nm (nanometers) and 2 to 3 watts @266 nm.

That is, and for example, DPSS lasers may produce useful Gaussian and TEM00 mode beam outputs as well as a single mode beam outputs, but these modes, and in particular the single mode beam output, do not provide the highest output power. DPSS lasers thereby require the use of beam shaping technology to produce a uniform flat top beam that is useful for driving a fiber laser system. Beam shaping technology and uniform flat top beams, however, require a stable laser input beam and, discussed below, it is difficult to obtain a stable output beam from a DPSS laser.

For example, the DPSS lasers commonly used for drilling multi-layered printed circuit boards for producing chip packaging/carriers generate a single mode output beam that becomes unstable when certain critical parameters, such as pump current and pulse repetition rate, are changed, or because of certain conditions arising from operation of the laser, such as thermal lensing or heating due to power dissipation. Such variations in the laser parameters may result, for example, in long term beam movement or drift and beam drift and pointing instability drift. Long term beam movement or drift may result in system down time since the optical beam delivery system must be realigned when the beam displacement exceeds tolerable limits, while short term beam movement or drift will typically result in distortion of the beam profile, the formation of hot and cold spots in the beam, and a loss in efficiency and in the power levels delivered by the laser beam.

Certain other problems are common and critical to fiber laser systems as well as to the laser machining systems of the prior art and one of the most significant of these problems is control of the laser beam pulse width, repetition rate, frequency and power characteristics to achieve the optimum effect at the workpiece being machined.

To illustrate, the laser machining systems of the prior art that employ UV range DPSS lasers to form microvias in multi-layered materials rely upon an ablation process to drill the microvias. The performance of DPSS UV lasers is limited in its processing capabilities, however, due to its beam propagation factor, which is typically in the range $M2=<1.2$, as well as by the fact that the drilling process is limited solely to UV ablation. UV DPSS lasers are also limited in their ability to dice or cut multilayered printed circuit board materials and other semiconductor wafer materials due to the etch rate of materials in of UV wavelengths, which is a function of the absorption of UV light in the materials, and because of variations or differences in the ablation energy density required for different materials as the DPSS laser cuts through the single and multiple layers of different materials. For example, the ablation of polymers requires relatively low energy densities while metals and ceramics require higher energy densities while DPSS lasers in the UV range have a relatively limited etch rate range of approximately 0.3 to 0.5 microns/pulse, depending on the energy density of the laser.

It must also be noted that while the etch rate of a given laser can be increased by increasing the laser output power, repetition rate or pulse width, or any combination thereof, such efforts can as easily be counterproductive for a number of reasons. For example, increases in one of the output beam power, the repetition rate or the pulse width will often cause reductions on others of these characteristics, so that the net result is often an actual decrease in the etch rate. In addition, simply increasing the power delivered to the target material may cause undesired effects at the target material, such as loss of control of the drilling or cutting dimensions, ragged cuts, blocking of the laser beam by the ablated material, thereby actually reducing the power delivered to the material, and unwanted deposits of ablated material in the drilling or cutting area, thus damaging the surface of the target material.

As discussed above, UV DPSS lasers also have problems with beam pointing and drift stability because the laser rods are diode pumped, which causes the rods to heat and thereby results in problems with thermal drift and pointing stability. The thermal lensing and harmonic generation processes required to convert the fundamental IR radiation of the lasers to the UV range required for the desired laser output beam also creates further issues with stability. In addition, the optical efficiency of UV DPSS lasers is relatively low due to inefficient diode pumping methods and the resulting energy losses are translated into heat, which further aggravates the problems with thermal drift and pointing stability.

As also discussed above, UV DPSS lasers are limited to operating in either a pulsed mode output or a continuous mode output but a UV DPSS laser cannot generate both mode outputs simultaneously, thereby limiting the ability of a system using UV DPSS lasers to generate the output beamforms most suited for different applications and materials. UV DPSS lasers also suffer from beam propagation issues due to its beam propagation value which is approximately M2=<1.2, which creates problems when using beam shaping technology such as diffractive optical elements and holographic optical elements by causing ringing effects. The ringing effects cannot be compensated for and generate undesirable laser beam imaging properties at the target material being processed.

The methods and apparatus of the present invention provide solutions to these and other related problems of the prior art.

SUMMARY OF THE INVENTION

The present invention is directed to fiber lasers and methods for constructing and using fiber lasers for micro-/nano-machining with stacked pulses and output beams comprised of continuous wave, pseudo-continuous wave and pulse sequence components.

The present invention includes a method for generating a fiber laser beam output comprised of a sequence of one or more pulse stacks. The method includes the steps of generating a plurality of sequences of laser beam pulses from a fiber laser wherein the pulses of each sequence of pulses are separated by a corresponding repetition interval and combining the plurality of sequences of laser beam pulses into at least one pulse stack output that includes a laser beam pulse from each sequence of laser beam pulses wherein an inter-stack interval between sequential pulse stacks and an inter-pulse interval between the pulses of each pulse stack is determined by an initial firing time and a repetition rate of the pulses of each sequence of pulses.

The step of generating a plurality of sequences of laser beam pulses may include the steps of driving a single optical fiber forming a fiber laser resonant cavity with a plurality of pumping lasers located in corresponding reflective end structures of the resonant cavity wherein each pumping laser corresponds to a sequence of laser beam pulses forming the at least one pulse stack and pumps the optic fiber with a sequence of pulses generated at a corresponding pulse sequence repetition rate. The step of combining the plurality of sequences of laser beam pulses into at least one pulse stack is in turn performed in the single fiber optic by injection of the pumping pulses from the pumping lasers into the single optic fiber forming the resonant cavity of the fiber laser.

In an alternate embodiment, the step of generating a plurality of sequences of laser beam pulses may include generating each of the sequences of pulses in a corresponding component fiber laser, each component fiber laser having an output axis and the component fiber lasers being arranged in a bundle wherein the output axes of the component fiber lasers are parallel and spaced radially apart. The step of combining the plurality of sequences of laser beam pulses into at least one pulse stack may then be performed by passing the sequence of output pulses of each of the component fiber lasers through an optical element that redirects the axis of each sequence of pulses into a single region of a second optical element that redirects the sequences of pulses into a single axis output.

Another implementation of the present invention is directed to a method for generating a laser beam output that includes a sequence of at least one of a continuous wave output component, a pseudo-continuous wave output component and a pulse sequence output component. According to the present invention, the laser may be a non-excimer laser, selected from one of a non-diode pumped high powered Nd:YAG solid state laser and a Nd:YLF solid stated laser, and a Nd:YAP solid state laser and a Nd:YVO$_4$ solid state laser wherein the selected laser operates at a repetition rate >1 kHz in a range of operational wavelengths from 180 nm to 4000 nm, or a diode pumped rare earth doped fiber laser wherein the pump diode is selected from a group of diodes have a core material selected from one of SiO$_2$ and Aluminosilicate and Phosphate glass and Glass and GeO$_2$ and wherein the dopant is selected from one of Erbium (Er) and Er/La and Ytterbium (Yb) and Tm and Tm—Ho and Samarium and Er—Yb and Neodymium (Nd) and Terbium-Ytterbium.

This method includes generating a sequence of output components in each of a plurality of component fiber lasers and combining the sequence of output components from each of the plurality of component fiber lasers into a single fiber laser output beam. In one embodiment, each of the plurality of component fiber lasers are arranged in a bundle wherein the output axes of the component fiber lasers are parallel and spaced radially apart. The combining of the sequence of output components from each of the plurality of component fiber lasers into a single fiber laser output beam then includes the steps of, in a first optical element, redirecting the axis of the output component of each of the plurality of component fiber lasers into a single region of a second optical element, and, in the second optical element, redirecting the axis of the output component of each of the plurality of component fiber lasers into a single axis output beam. In a yet further alternate embodiment, the combination of the sequence of output components from each of the plurality of component fiber lasers into a single fiber laser output beam includes combining the output components from each of the plurality of component fiber lasers into a single optic fiber by optical junctioning of the output of each of the plurality of component fiber lasers into the single optic fiber, wherein the output of the single optic fiber is the single axis output beam.

The fiber laser may be constructed as a multi-pumped fiber laser that includes an optical fiber, a first end structure, a second end structure and an output path. The first end structure includes a first optical path including a first beam splitter for coupling an output of a first pump laser to the first end of the optical fiber to drive the optical fiber and a second optical path including the first beam splitter for coupling the first end of the optical fiber to an optical reflecting element assembly to form a first reflecting end of the resonant optical cavity. The second end structure includes a third optical path including a second beam splitter for coupling an output of a second pump laser to a second end of the optical fiber to drive the optical fiber and a fourth optical path including the second beam splitter for coupling the second end of the optical fiber to a second optical reflecting element assembly to form a second reflecting end of the resonant optical cavity. The output path includes a third beam splitter located in the fourth optical path for coupling an output from the second end of the optical fiber passing through the fourth optical path to a beam output of the fiber laser.

The multi-pumped laser may further includes a vortex lens element located between the second end of the optical fiber and the third and fourth optical paths of the second end structure for shaping the energy profile of the beam output of the fiber laser to have a region of reduced power in the central regions of the beam energy profile, or the output path may further include a harmonic generation module for wavelength transformation of the output of the optic fiber and a vortex lens element for shaping the energy profile of the beam output of the fiber laser to have a region of reduce power in the central regions of the beam energy profile wherein the vortex lens is located at one of an input of the harmonic generation module and an output of the harmonic generation module.

In further embodiments, the fiber laser for generating laser beam pulse stacks may include a plurality of component fiber lasers for generating individual sequences of output pulses and an optical structure for combining the of each of the plurality of component fiber lasers into a single fiber laser output wherein the sequences of output pulses from at least certain selected component fiber lasers are synchronized in time so that the pulses of each sequence of pulses are separated by a corresponding repetition interval and so that an inter-stack interval between sequential pulse stacks and an inter-pulse interval between the pulses of each pulse stack is determined by an initial firing time and a repetition rate of the pulses of each sequence of pulses.

The optical structure for combining the sequences of pulses from the component fiber lasers may include an optical junction connected from each component fiber laser to join the sequence of pulses from each component fiber laser into a single optic fiber providing a fiber laser output comprised of a summation of the sequence of pulses from each component fiber laser. In other embodiments, each of the plurality of component fiber lasers are arranged in a bundle wherein the output axes of the component fiber lasers are parallel and spaced radially apart, and the optical structure for combining the sequences of pulses from the component fiber lasers includes a first optical element redirecting the axis of the output component of each of the plurality of component fiber lasers into a single region of a second optical element and the second optical element redirecting the axis of the output component of each of the plurality of component fiber lasers into a single axis output beam.

In yet another embodiment, the fiber laser generates an output laser beam including a sequence of at least one of a continuous wave output component, a pseudo-continuous wave output component and a pulse sequence output component, wherein the fiber laser include a plurality of component fiber lasers wherein each component fiber laser generates an output component including at least one of a continuous wave output component, a pseudo-continuous wave output component and a pulse sequence output component and an optical structure combines the output components of each of the plurality of component fiber lasers into a single fiber laser output. In this embodiment, the output components generated by at least selected ones of the plurality of component fiber lasers are synchronized in time so that the single fiber laser output includes a sequence of at least one of a continuous wave output component, a pseudo-continuous wave output component and a pulse sequence output component.

In this embodiment the optical structure for combining the output components of the component fiber lasers may include an optical junction connected from each component fiber laser to join the output components of each of the component fiber lasers into a single optic fiber output of the sequence of at least one of a continuous wave output component, a pseudo-continuous wave output component and a pulse sequence output component. In an alternate embodiment, each of the plurality of component fiber lasers are arranged in a bundle wherein the output axes of the component fiber lasers are parallel and spaced radially apart, and the optical structure for combining the sequences of pulses from the component fiber lasers includes a first optical element redirecting the axis of the output component of each of the plurality of component fiber lasers into a single region of a second optical element, and the second optical element redirecting the axis of the output component of each of the plurality of component fiber lasers into a single axis output beam. In yet another embodiment, each of the component fiber lasers generates a pulse sequence output component and the generation of pulse sequence output components by the component fiber lasers is synchronized such that a combination of pulse sequence output components from selected ones of the component fiber lasers combine in time in the fiber laser output beam into at least one of a continuous wave output component and a pseudo-continuous wave output component.

BRIEF DESCRIPTION OF THE DRAWINGS

The invention will now be described, by way of example, with reference to the accompanying drawings in which:

FIGS. 4A-4C are illustrations of beam profiles through the lasers of FIGS. 3B through 3D;

FIGS. 7A-7E are diagrammatic illustrations of fiber laser systems for generating stacked pulse beam outputs;

FIG. 8 is a diagrammatic representation of a fiber optic laser beam system for use as a micro-/nano-machining system;

FIGS. 9A-9C diagrammatic representations of a fiber laser comprised of bundled component fiber lasers;

FIGS. 16B, 16C, 16D, 17A, 17B and 18 are representations of alternate embodiments of a fiber laser micro-/nano machining system;

DETAILED DESCRIPTION OF THE INVENTION

Figure 1:
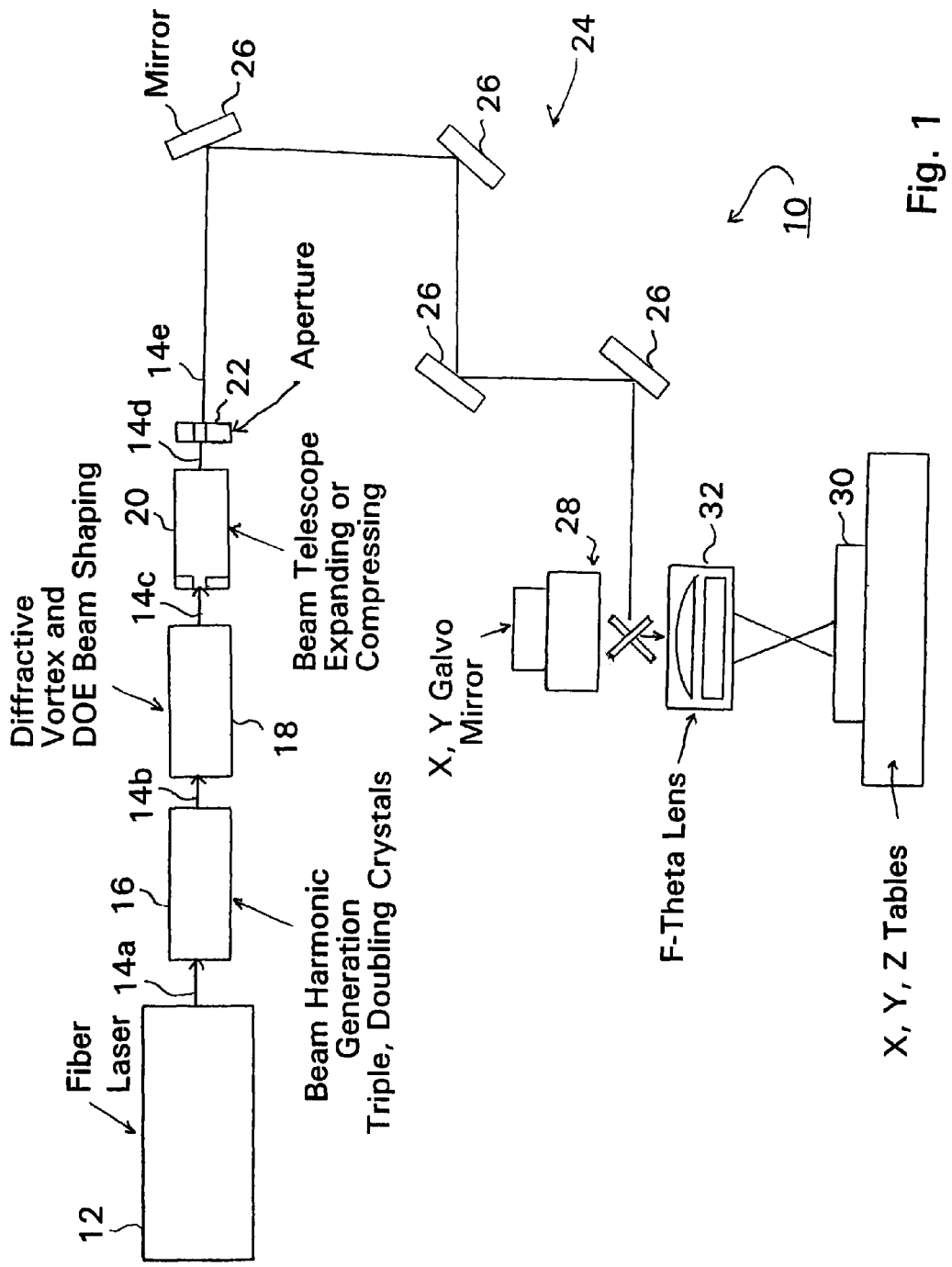
FIG. 1 is a diagrammatic illustration of a fiber laser micro-/nano-machining system.

As described above, the present invention is directed to methods and apparatus for constructing fiber lasers and to methods and apparatus using fiber lasers to generate laser beams having selectable pulse width, repetition rate, frequency and power characteristics for micro- and nano-machining of various materials.

As will be described in the following, the method of laser micro-/nano-drilling with stacked pulse beams or with beams comprised of combinations of one or more of continuous, pulsed continuous or pulse beam components may be performed with appropriately triggered and driven single lasers, including multipumped lasers, or with appropriately triggered and driven fiber lasers. Examples of such lasers would include a high power non-excimer laser, such as a non-diode pumped Nd:YAG, Nd:YLF, Nd:YAP or Nd:YVO$_4$ solid state laser operating at a repetition rate >1 kHz with a range of operational wavelengths from 180 nm to 4000 nm or a diode pumped fiber laser constructed from group of rare earth doped fiber laser materials having core materials comprised, for example, of SiO$_2$, Aluminosilicate, Phosphate glass, Glass, GeO$_2$, and so on, and using dopants comprised of rare earth materials such as Erbium (Er), Er/La, Ytterbium (Yb), Tm, Tm—Ho, Samarium, Er—Yb, Neodymium (Nd), Terbium-Ytterbium, and others.

A. General Discussion of Fiber Lasers

Like a DPSS (Diode Pumped Solid State) laser, fiber lasers are diode pumped devices, but unlike DPSS lasers, which are comprised of a solid rod of lasing material, a fiber laser is comprised of a fiber optic that is doped with various dopants can typically generate a laser output beam having a wavelength in the range of 1050 to 1110 nm, which can then be frequency tripled or quadrupled to create an output beam in the UV wavelength range of 180 nm to 400 nm.

A fiber laser posses further advantages over a solid rod diode laser. For example, since a fiber laser is constructed of a fiber it is less susceptible to thermal changes than the solid rod of a DPSS laser and thereby provides a significantly more stable beam output. In addition, the fiber lasing medium can be readily constructed as a multi mode fiber that can provide a multi mode output beam that is thereby significantly easier to beam shape with a variety of different beam shaping techniques.

In further example, such as a fiber laser based beam delivery system used to drill microvias through multilayered printed circuit board materials, fiber laser system can achieve a diffraction-limited beam quality of approximately M2=1. This beam quality is defined by the refractive-index profile of the fiber, unlike the case of DPSS lasers, is thereby insensitive to thermal or mechanical fluctuations or the variations in optical power level that plague standard solid state diode lasers. The glass host used in fiber lasers also broadens the optical transitions in the rare-earth ion dopants, yielding continuous turnability; and the variety of possible rare-earth dopants, such as Yb, Er, and Tm, yields broad wavelength coverage in the near-IR spectral region. In addition, diode pumped fiber lasers offer low heat dissipation and significantly improved heat removal, due to their high surface-area-to volume ratio, thus allowing room-temperature operation.

In addition, recent advances in fiber laser technology have greatly increased the power output capabilities of both continuous-wave (CW) and pulsed fiber lasers with respect to the standard solid state DPSS lasers. The use of doped single mode and multimode fiber lasers permit output beam power levels beyond the single mode limit of the prior art. In addition, and as will be discussed further in the following descriptions, the multi-mode output can take the form of a non-uniform high frequency output or of a variety of other non-TEM00 modes with a variety of beam configurations, which in turn can be used to illuminate arrangements of lenses and beam shapers to form optimized flat top beam outputs.

B. Generation of Fiber Laser Beams Using Vortex Lenses

Next considering the generation of laser beams for micro/nano-machining processor, of in general as a source of a beam for pumping or driving fiber lasers, FIG. 1 is a generalized diagrammatic illustration of a fiber laser beam delivery system 10 according to the present invention, such as a micro/nano-machining system. As indicated therein, the system 10 includes a fiber laser 12 whose laser beam output 14$a$ is passed through a beam harmonic generator 16 comprised, for example, of an arrangement of tripling and doubling crystals such as are conventional in the art. The output 14$b$ of beam harmonic generator 16 is then passed through a beam shaper 18 comprised of a diffractive optical element (DOE) wherein beam shaper 18 is often comprised of a vortex lens, as discussed below. The beam output 14$c$ of beam shaper 18 is then passed through a beam telescope 20, which expands or contracts the beam width, and the beam output 14$d$ of beam telescope 20 then through an aperture 22 that performs the final shaping of shaped beam 14$e$.

The shaped output beam 14$e$ from aperture 22 then passes through an optical path 24 comprised, for example, of one or more fixed redirection mirrors 26 and a moveable x,y galvanometer mirror 28 to direct the beam 14 to a target workpiece 30, with a lens 32, such as an F-Theta lens, being located in the beam to direct and focus the beam onto the target workpiece 30.

According to the present invention, and as has been illustrated in FIG. 1, the use of vortex lenses implemented, for example, as diffractive optical elements (DOEs), within the optical path of a beam delivery system provides a particular advantage when applied to laser processing, and specifically when used in microvia drilling beam delivery systems, by shaping the laser beam so that there is less optical power in the central regions of the beam, that is, and for example, so that the beam energy profile is generally donut shaped or some variant thereof. As a result, there is less power passed through the center of the beam shaping optics or fiber optics that are illuminated by the vortex lens shaped beam, which makes the beam less-destructive to optical elements within the beam path when laser power exceeds, for example, 3 watts.

According to the present invention, diffractive vortex lenses employed in the beam path can also provide a variety of beam shapes, each of which has an energy profile with reduced energy levels in the central regions of the beam. Vortex lenses can thereby, for example, compensate for undesired characteristics in the energy profile of the output of fiber lasers, which often produce energy beam profiles central time varying central higher energy level spots by adaptively filtering out the high energy levels in the central regions of the beams. For example, a vortex lens used, for example, in combination with a diffractive beam shaping system, can be used to compensate for changes in a beam energy profile, such as an energy distribution increase or decrease in the central region of the beam resulting from a change in certain beam parameters during a machining process, such as n increase in the beam pulse repetition rate from, for example, 10 kHz to 50 kHz, and to thereby maintain a uniform beam energy profile.

Figure 2:
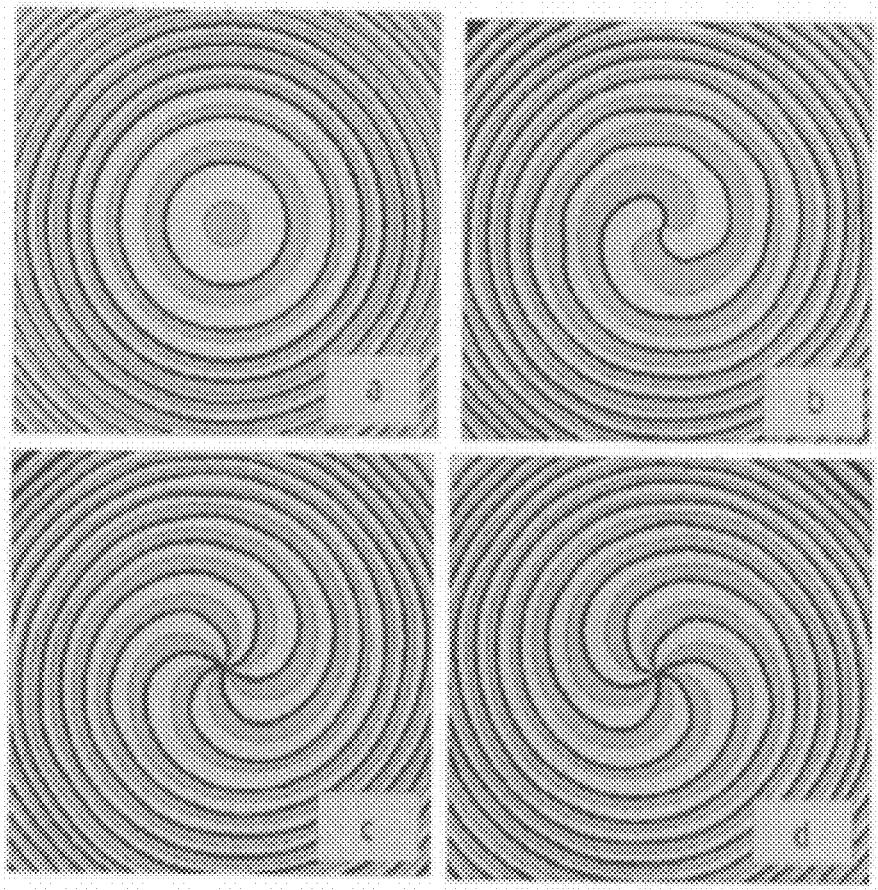
FIGS. 2A-2D are illustrations of the transformation function of a diffractive optical element and exemplary vortex optical elements.

For purposes of illustration, a representation of the transformation function of a traditional diffractive optical element (DOE) is shown in FIG. 2A while representations of exemplary transformation functions for several different vortex lenses are shown in FIGS. 2B, 2C and 2D.

C. Vortex Lenses in Shaping Beams in Multi-Pumped Fiber Lasers

In conventional systems of the prior art vortex lenses are typically used for launching laser beams generated by fiber lasers or other forms of lasers into optical fibers, that is, to optimize the shape of the beam that has been generated by the laser, such as a fiber laser.

According to the present invention, however, and as illustrated in part in FIG. 1 wherein a vortex lens is used in the optical path of a beam delivery system, vortex lenses are used within the fiber laser system to, for example, to optimize the fiber laser output to a shape that is less susceptible to beam drift and alignment issues found with DPSS lasers such as are used in the industry today. As will be described in the following, the present invention uses a diffractive vortex lens and DOE/HOE beam shaping system in a fiber laser to create a beam configuration and energy distribution that allows for a greater density of energy per unit area than standard DPSS systems at repetition rates that exceed, for example, 50 kHz.

Referring to FIGS. 3A, 3B, 3C and 3D, therein are illustrated a general implementation of a multi-pumped fiber laser and three exemplary embodiments of a multi-pumped fiber laser 34 employing vortex lenses within the fiber laser beam generation mechanism according to the present invention.

Figure 3A:
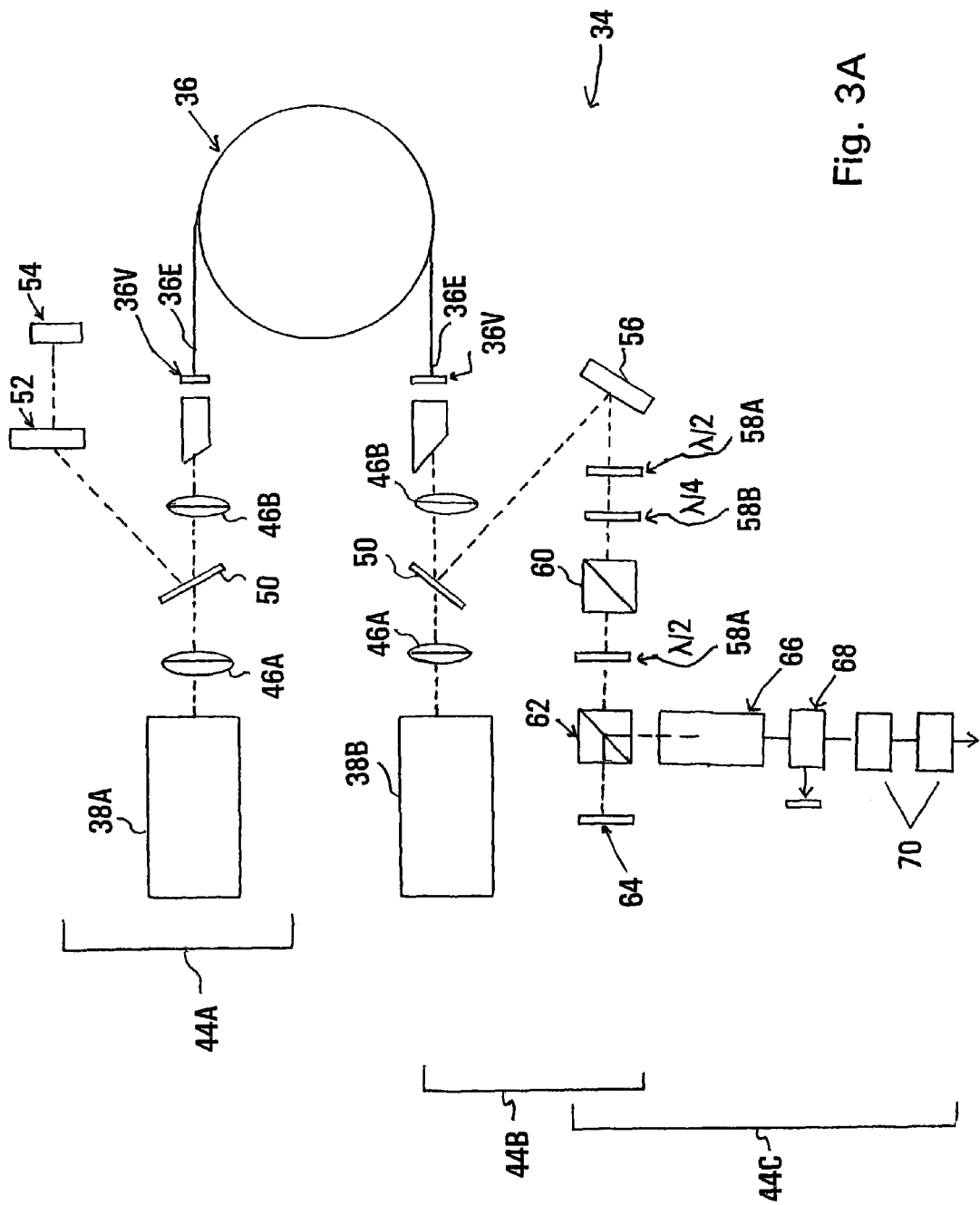
FIGS. 3A-3D are diagrammatic representations of dual pumped fiber lasers.

As represented in FIGS. 3A-3D, it will be noted that the three illustrated exemplary embodiments of a fiber laser of the present invention have certain elements in common, while will be discussed with reference to FIG. 3A. As shown in FIG. 3A, an exemplary basic fiber laser 34 of the present invention may be double end pumped, that is, the fiber laser 34 includes an optical fiber element 36 forming the main structural element of the resonant optical cavity wherein each end 36E of the laser fiber optic 36 is driven by a pump laser 38, indicated as pump lasers 38A and 38B, and wherein pump lasers 38 may be comprised, for example, of diode lasers. In addition, each end of fiber optic 36 will often include a diffractive vortex lens 36V to couple the fiber optic 36 to the pumping beams 42 generated by pumping lasers 38. Also, and although not shown in FIGS. 3A-3D, it will be understood by those of ordinary skill in the art that a system incorporating one or more fiber lasers 34 will includes laser control circuitry for controlling the generation of output by the laser. In this instance, the control circuitry will control the timing and firing of the diode pump lasers.

Each fiber laser 34 further includes two cavity end structures 44, designated as end structures 44A and 44B. As illustrated, end structure 44A, which arranged between pump laser 38A and one end 36E of fiber optic 36, includes a shaping and focus lens 46A between the output of pump laser 38A, a beam splitter 50 and a shaping and focus lense 48B located between the other side of the beam splitter 50 the laser beam input/output of fiber optic 36 and the corresponding vortex lens 36V.

As will be understood by those of skill in the arts, the output of pump laser 38A passes through focus lens 46A, beam splitter 50 and focus lens 46B and through vortex lens 36V into fiber optic 36 to thereby drive one end of the fiber laser 34. In the reverse direction, the laser beam within fiber optic 36 exits fiber optic 36 through the vortex lens 36V and passes through focus lense 46B to splitter 50, wherein it is redirected to modulator 52 and high reflectivity mirror 54 and reflected to pass along the same path in reverse to enter the first end of fiber optic 36 together with the pump beam from pump laser 38A. It will therefore be recognized that the path into fiber optic 36 from pump laser 38A comprises the path by which the first end of fiber optic 36 is pumped, or driven, while the path from fiber optic 36 to and from mirror 54 through beam splitter 50 forms one end of the laser resonating cavity.

End structure 44B, in turn, is similar to end structure 44A and is arranged between pump laser 38B and the other end 36E of fiber optic 36. End structure 44B again includes a shaping and focus lens 46A between the output of pump laser 38B, a beam splitter 50 and a shaping and focus lense 48B located between the other side of the beam splitter 50 the laser beam input/output of fiber optic 36 and the corresponding vortex lens 36V. Again, the output of pump laser 38B passes through focus lens 46A, beam splitter 50 and focus lens 46B and through vortex lens 36V into fiber optic 36 to thereby pump, or drive, the second end of the fiber laser 34.

End structure 44B again also comprises a path forming the second end of the resonating cavity of the laser, but differs from end structure 44A because end structure 44B is a connected to an output path 44C by which the laser beam from the fiber laser is delivered to, for example, the optical path through a beam delivery system to a target. Again, the laser beam within fiber optic 36 exits fiber optic 36 through the vortex lens 36V and passes through focus lense 46B to splitter 50, wherein it is redirected to, for example, a redirection mirror 56. Redirection mirror 56 in turn directs the beam through a path that includes half and quarter wavelength mirrors 58A and 58B, Q switch 60 and beam splitter 62 and to high reflectively mirror 64. High reflectivity mirror 64 reflects the beam back along this path in the reverse direction, that is, back to beam splitter 50 and through beam splitter 50 and into the second end of fiber optic 36, thereby forming the second end of the laser resonating cavity.

Lastly, the output path 44C of fiber laser 34 is comprised of a second path from beam splitter 62 and typically includes a harmonic generation nodule 66, a dichromatic element 68 that will typically include a beam dump for directing the beam out of the path and thereby away from the final laser output, and a conventional beam shaper 70, which will typically be implemented as a diffractive optical element (DOE) or a holographic optical element (HOE).

As described above, a fiber laser 34 of the present invention as exemplified in FIG. 3A, 3B, 3C or 3D will include one or more vortex lenses within the fiber laser beam generation mechanism. The three exemplary implementation of the present invention discussed above are illustrated in FIGS. 3B, 3C and 3D. In the implementation shown in FIG. 3B, for example, the vortex lens 72 is interposed in beam output path 44C between beam splitter 62 and the input of harmonic generation module 66. In the example shown in FIG. 3C, the vortex lens 72 is located at the second output of fiber optic 36 and thereby also performs the functions of vortex lens 36E, if the system includes a vortex lens 36E. Lastly, in the implementation shown in FIG. 3D the vortex lens 72 is arranged after harmonic generation module 66, that is, between the output of harmonic generation module 66 and the input of beam shaper 70.

Figure 3B:
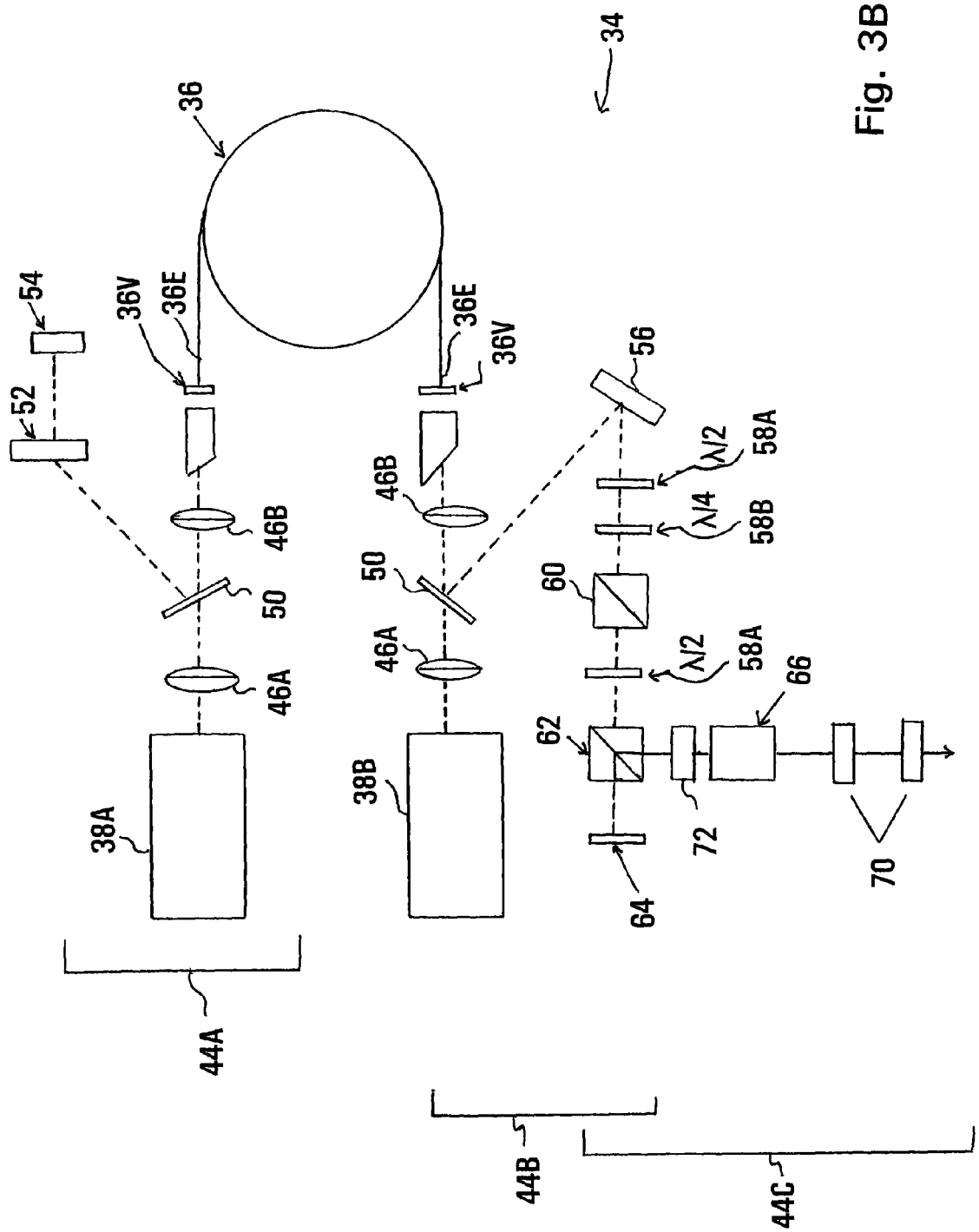
Figure 3C:
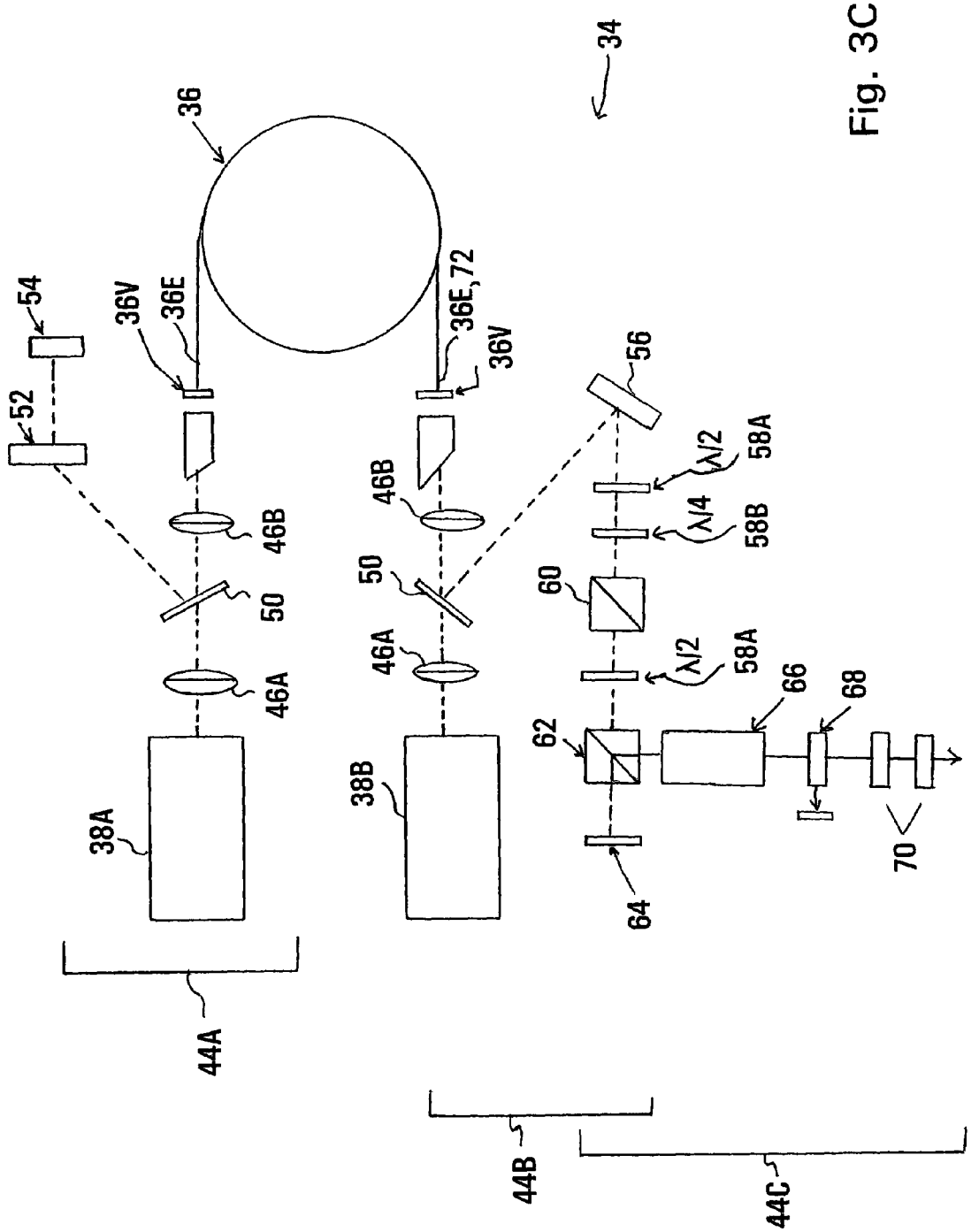
Figure 3D:
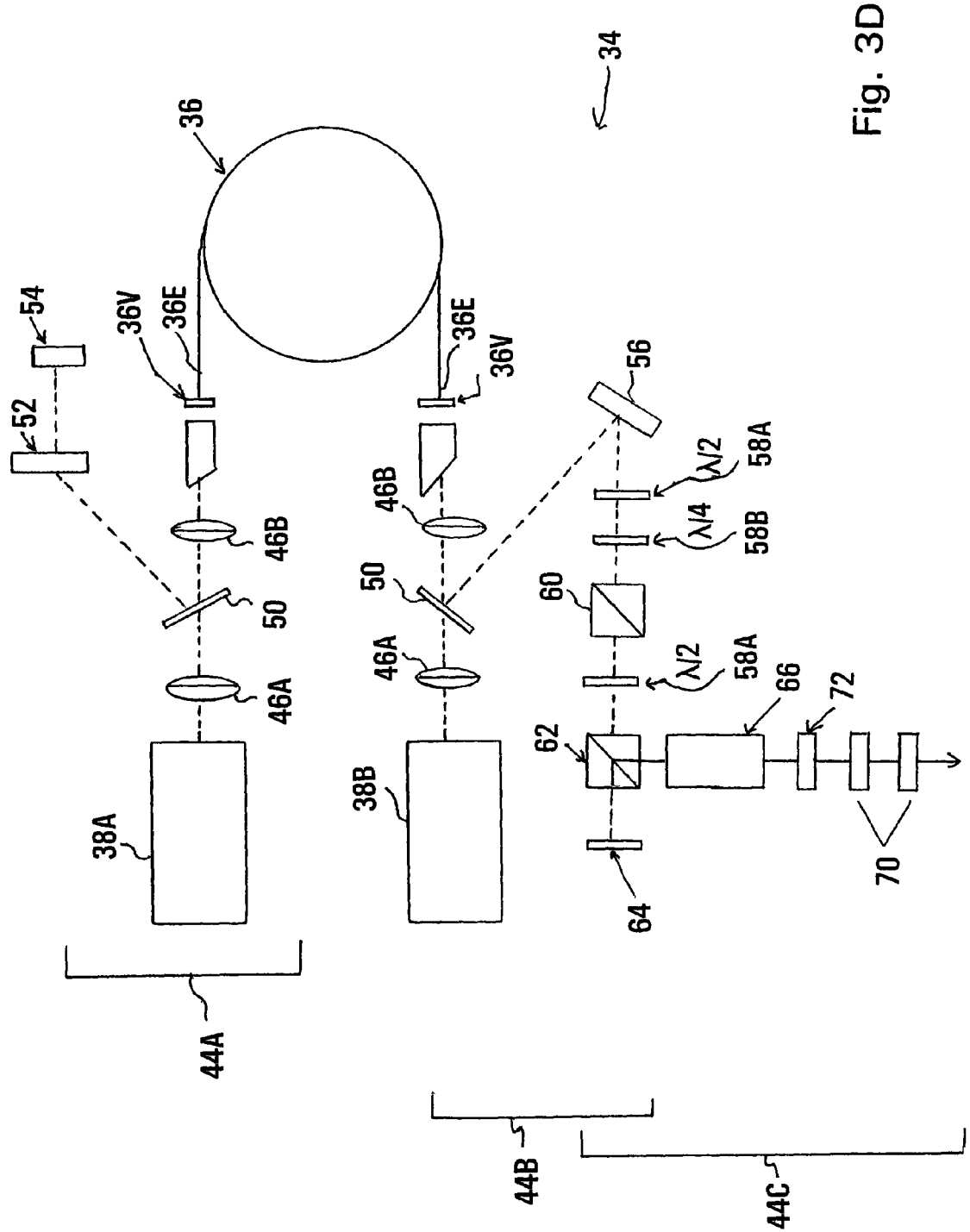

It should be understood that although dichromatic element 68 is not shown in FIGS. 3B and 3D, dichromatic element 68 may be included in these implementations and typically in the locations shown in FIG. 3A, if desired or if necessary.

Lastly in this regard, FIGS. 4A, 4B and 4C correspond respectively to FIGS. 3B, 3C and 3D and are diagrammatic illustrations of certain of the elements and beam profiles along the beam paths of the implementations illustrated in FIGS. 3B, 3C and 3D.

Figure 3E:
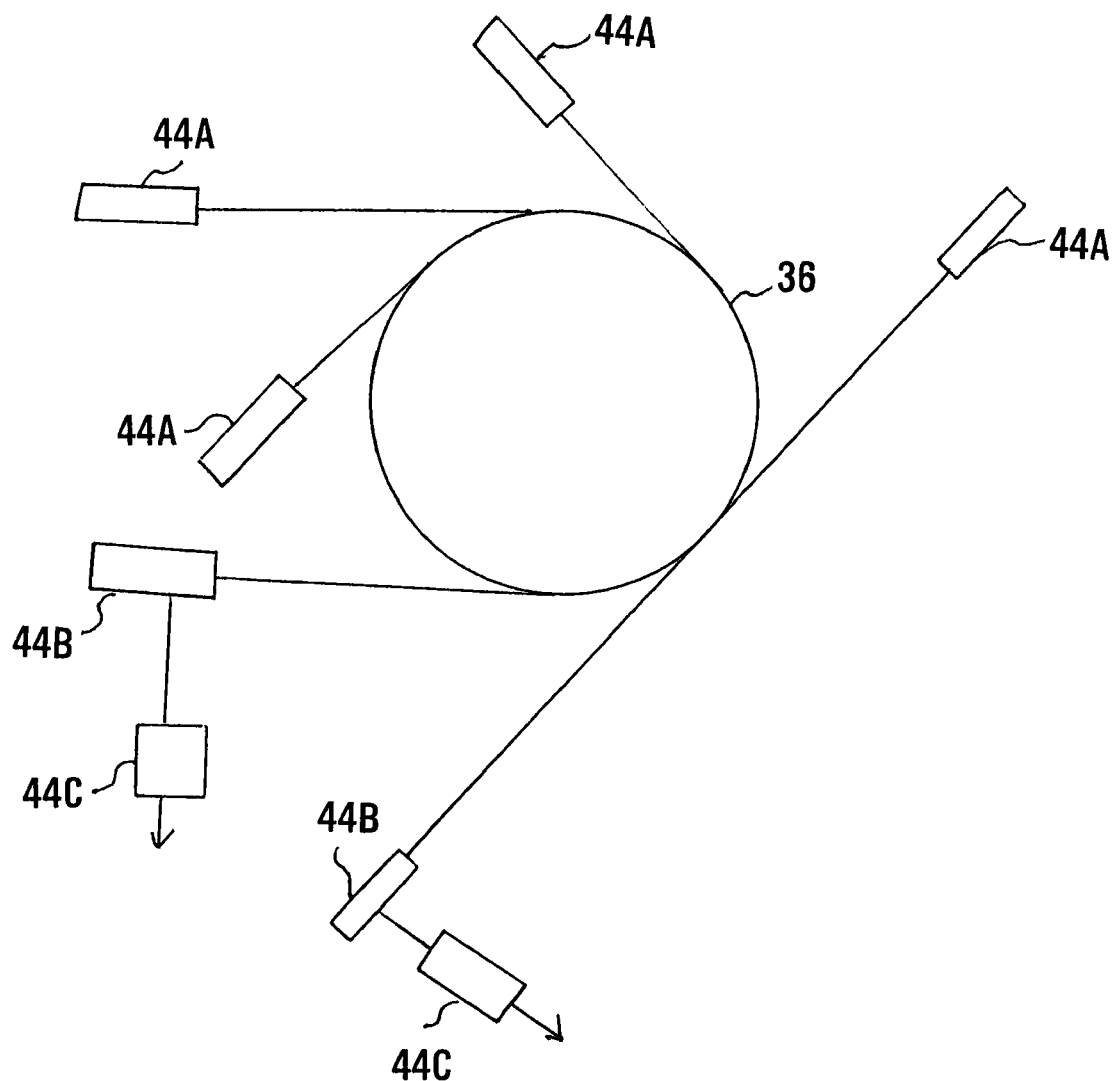
FIGS. 3E and 3F are diagrammatic representations of multi-pumped lasers.
Figure 3F:
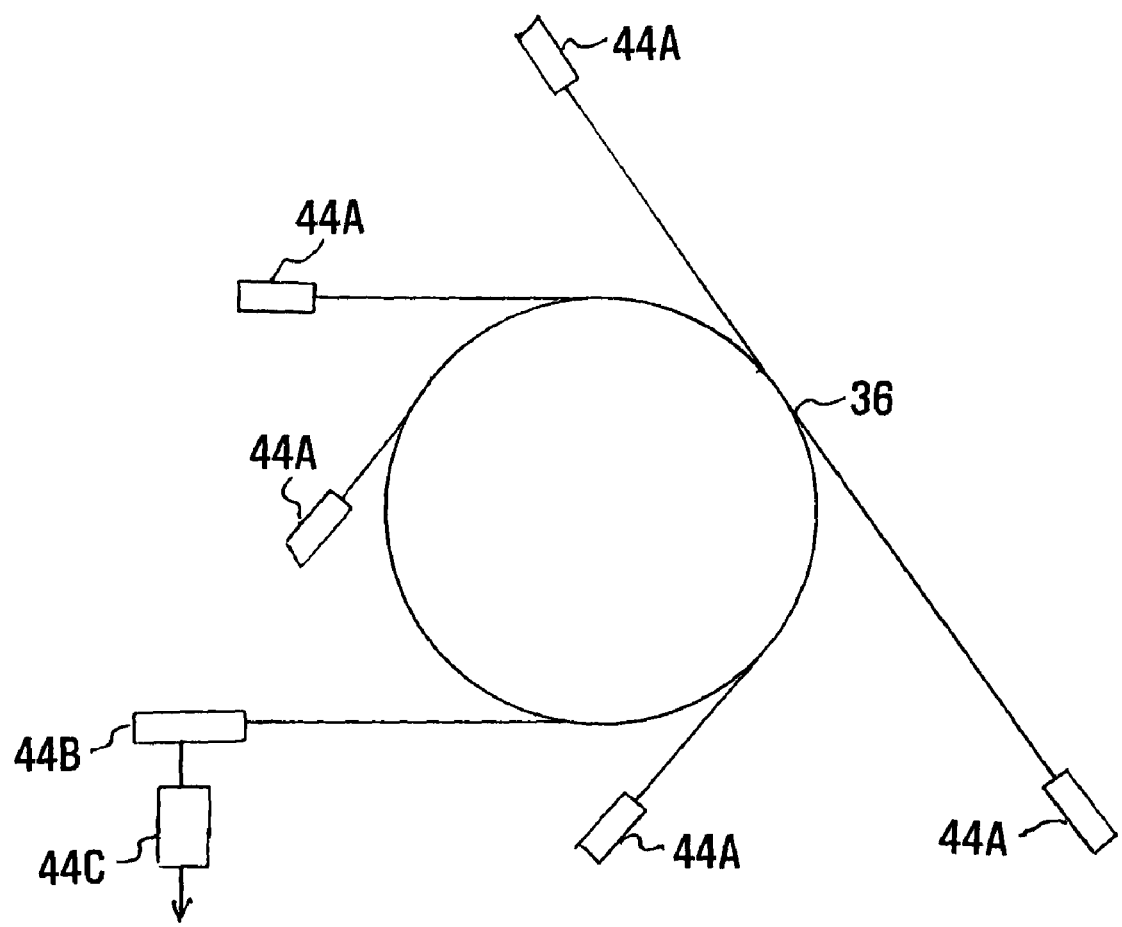

It should also be understood with regard to the above discussed dual multi-pumped fiber lasers of the present invention that the multi-pumping configuration as described with reference to FIGS. 3B-3D may be extended to include more than the illustrated two pump lasers 38A and 38B located at the two end structures 44A and 44B of the fiber optic 36. For example, and as illustrated in the diagrammatic representation of FIGS. 3E and 3F, multiple end structures 44A with their pump lasers 38A may be added to the basic configuration illustrated in FIGS. 3B-3D by Y-connecting additional end structures 44A or pairs of end structures 44A and 44B into the fiber optic 36. In this regard, it should be noted that the added end structures 44B may be implemented as the end structures 44B described above when it is desired that the fiber laser 34 have multiple output beams. Alternately, the added end structures 44B may be implemented as reversed end structures 44A when it is desired that the fiber laser 34 have a single beam output but be capable of generating a plurality of separately controllable pulse outputs.

D. Laser Output Beams Comprised of Stacked Pulses

As will be described in following, single and multiple multi-pumped fiber lasers as described above may be used in beam generation and delivery systems, such as are used in laser micro/nano-machining systems, to generate beams comprised of stacked pulses with individual pulse durations ranging from 2 to 200 ns and wherein the pulses are stacked with a pulse separation ranging between pico seconds and several tens of nanoseconds. Such methods can generate tacks of several 10's of pulses, wherein a tack is defined for purposes of the present invention as a sequence of closely spaced or overlapping pulses forming an identifiable group that is separated in time, or space, from other such stacks.

A fiber laser of present invention thereby generates multiple stacks of intense pulses per pulse period to increase the speed of the micro-machining process and to increase the photo disassociation of materials beyond that of standard photo ablation. According to the present invention, a stack of pulses appears to create an intense oft punch on the material to be processes wherein the intense soft punch is significantly different from both conventional focal point machining and conventional single pulse processing. Stated another way, the stacking of pulses of short durations, such as of less than 1 nanosecond, appears to create a percussion process wherein the individual intensity of the "punches" appears to be constant but wherein their collective energy is deposited over a greater duration than each individual pulse. This is particularly useful for drilling, dicing, cutting, skiving or otherwise processing both hard materials and multilayered materials where it is necessary to vaporize or ablate, for example, metals covering underlying polymers. This method also allows the variation of energy density without the need to vary the pulse rate, and allows single pass processing of thin films, including polymer dielectric materials as well as thin metal films or other films used in trimming resistors or fuse arrays in memory chips.

As will be described, such laser outputs may be achieved, for example and according to the present invention, by appropriate synchronization of the diode pump lasers, such as in the case of a multi-pumped laser as described above wherein the diode pump lasers are synchronized so that the fiber laser can produce independent pulses with a specific separation. Such methods may employ a dual pumped fiber laser as described herein above with reference to FIGS. 3A-3D, or a similar fiber laser wherein additional pump lasers are optically coupled into the single optical fiber. Alternately, the system may employ any of several possible configurations of multiple fiber lasers as pumping lasers driving a bundle of optic fibers or coupled into a single optic fiber.

Another method for achieving these purposes is the combining of multiple fiber lasers into a bundle format to create a fiber laser Gattling gun wherein, for example, each fiber laser could be pulsed at a different frequency or frequencies to allow stacking of pulses or synchronized to form a single pulse of greater intensity. The outputs of the bundle of fiber lasers could collected and shaped using DOE/Hoe optics to form a uniform single beam, or into a collinear stacked set of illuminating beams, for, for example, processing microvias in printed circuit boards, or for fused blowing or resistor array cutting on memory chips and other semiconductor devices that need modification or trimming or re-work. This bundled configuration would also provide a unique opportunity for standard fly eye homogenizer use since the fiber laser output could be made to be multi-mode to provide greater use of standard laser imaging methods, such as mask or aperture imaging typically used on traditional UV laser drilling or photo-lithography systems.

Figure 5A:
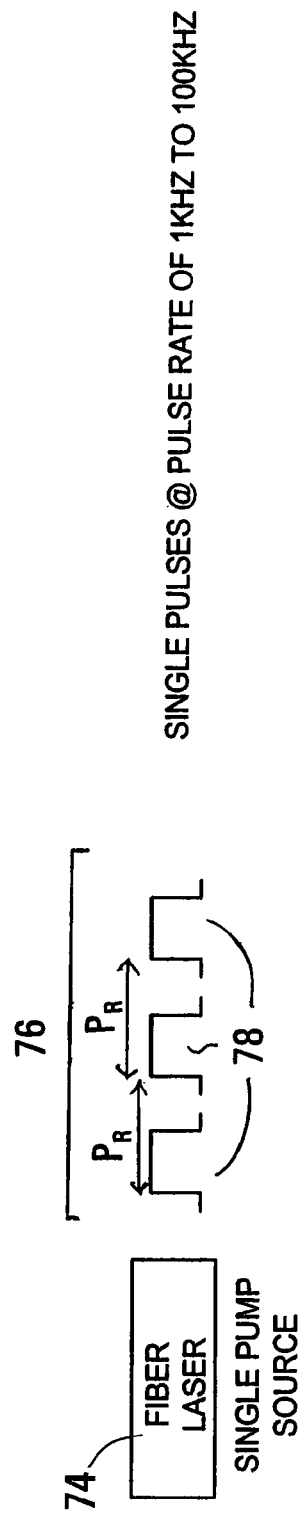
FIGS. 5A, 5B, 6A and 6B are illustrations of stacked pulse beam outputs.
Figure 5B:
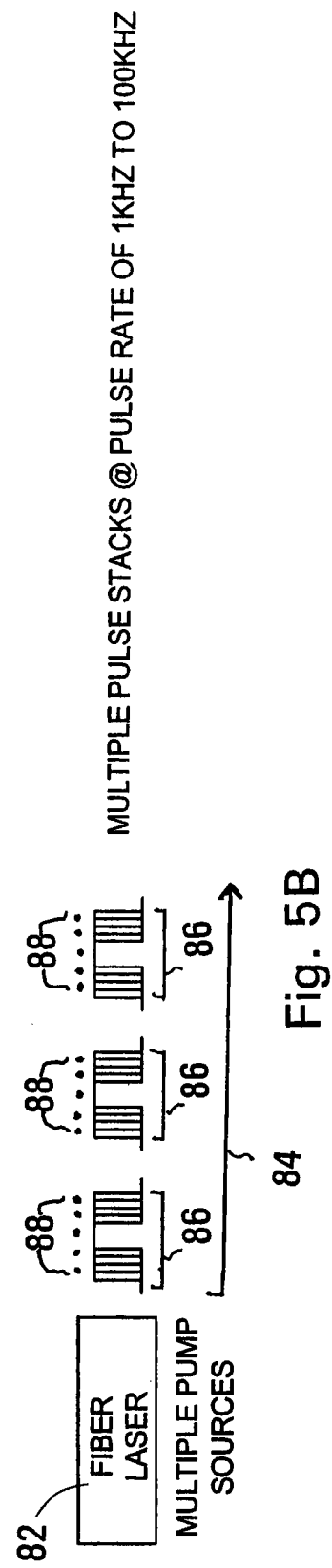
Figure 6B:
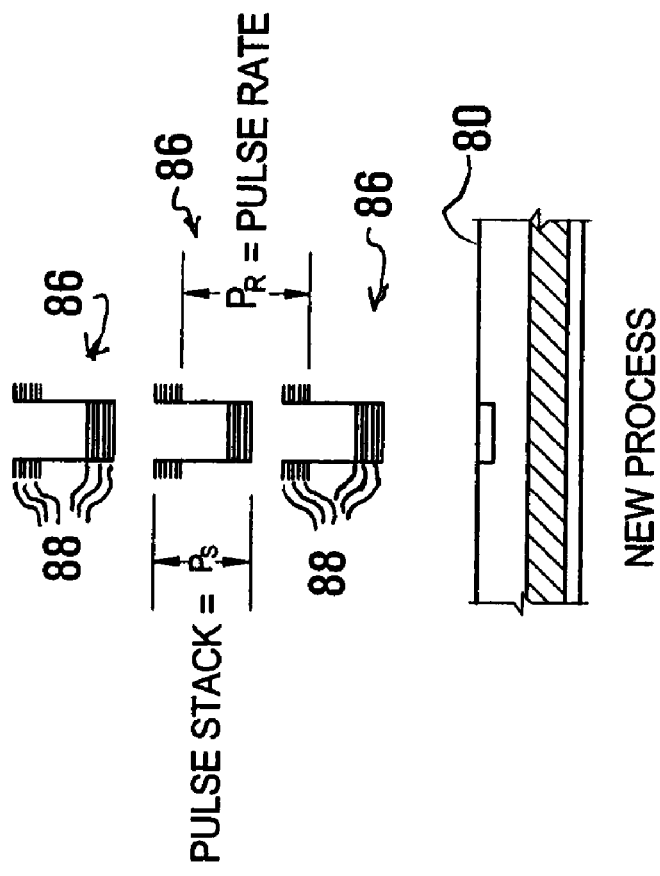
Figure 6A:
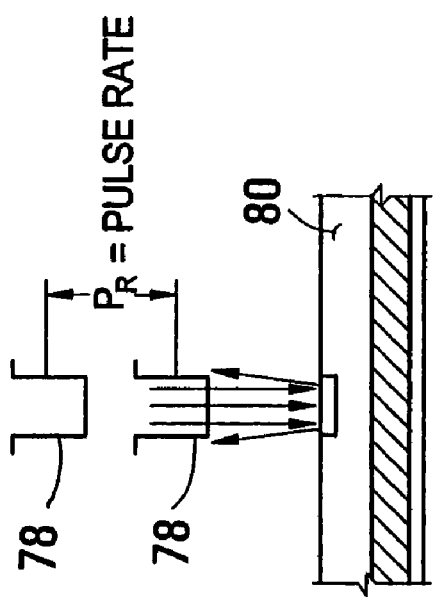

The above discussed methods are illustrated in FIGS. 5A, 5B, 6A and 6B wherein FIG. 5A shows the method of the prior art wherein a laser 74 generates a sequence 76 of single pulses 78 spaced apart by a pulse repetition rate, or interval, Pr, and FIG. 6A illustrates a sequence 76 of single pulses 78 directed against a target 80.

FIG. 5B, in turn, illustrates the method of the present invention wherein a laser 82, such as a fiber laser or arrangement of fiber lasers of the present invention arranged as discussed below, is used to generate a sequence 84 of stacks 86 wherein each stack 86 is comprised of multiple closely adjacent or overlapping pulses 88. FIG. 6B in turn illustrates such a sequence 84 of stacks 86 of pulses 88 directed against a target 80 and it is shown in FIGS. 5B and 6B that pulses 88 in successive stacks 86 are separate in time by a pulse repetition rate, or interval, Pr, which determines the interval between successive stacks 86. Each stack 86 in turn has a length, or duration in time, Ps, that is determined by the number of pulses 88 in each stack 86 and the interval between successive pulses 88 of the stack 86. It will be appreciated by those of skill in the relevant arts that the length and number of pulses in each stack and the interval between stacks can thereby be determined by controlling the number of pulses, the repetition rate of each laser 74 and the relative firing times of the lasers 74. It will also be appreciated that very complex sequences of pulses and stacks, including specified sequences of pulses within the stacks and selected sequences of stacks that vary over time can thereby be generated by the method of the present invention, thereby allowing the generation of sequences of pulse and stacks that are tailored to any situation.

Figure 7B:
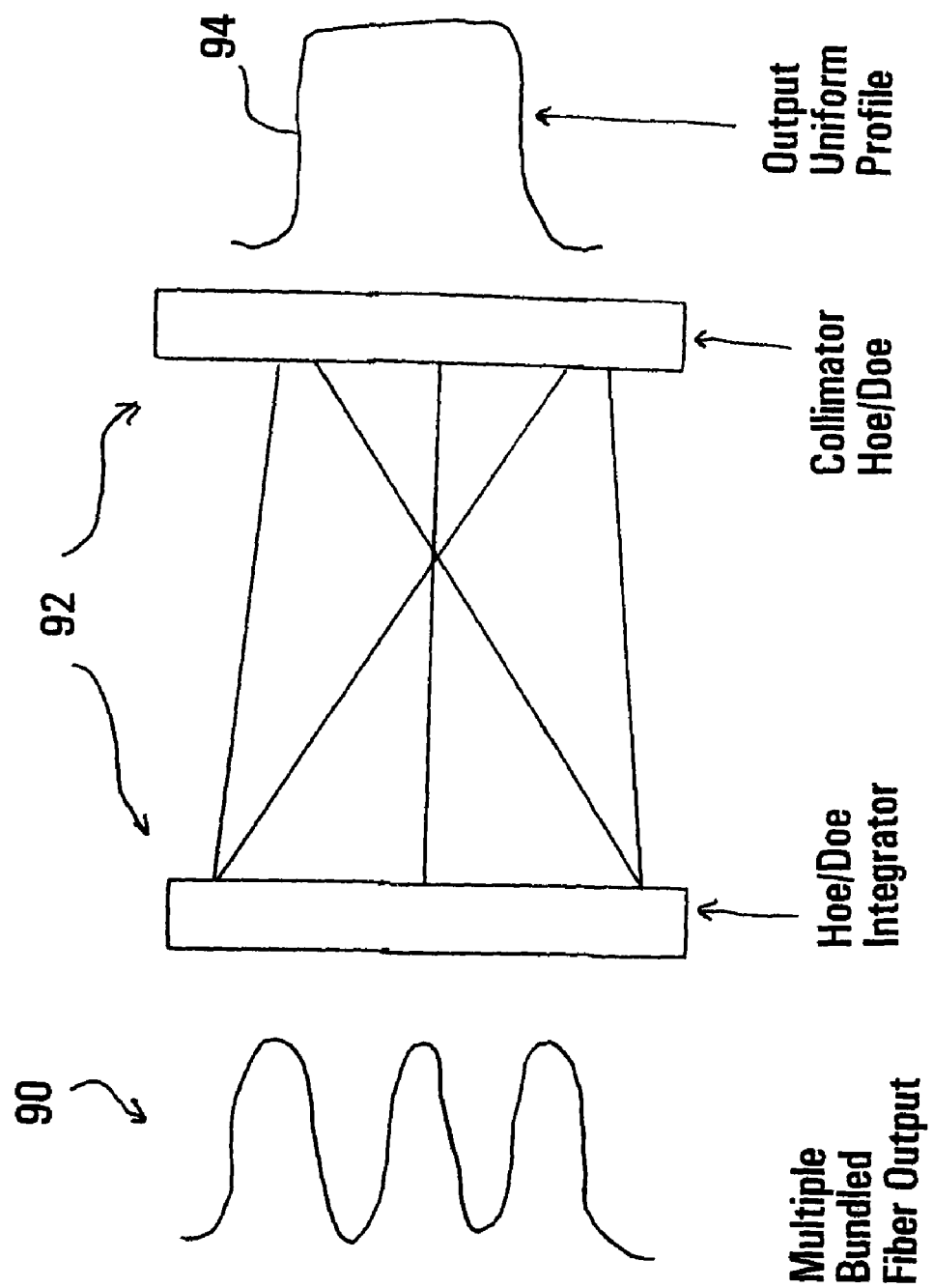

FIGS. 7A and 7B in turn illustrate various apparatus for combining the multiple output pulses of a plurality of fiber lasers, such as fiber lasers 34, in a Gatling gun configuration into a single output pulse having a desired uniform energy profile. FIGS. 7A and 7B illustrate the generation of multiple output pulses 90 by a bundle 92 of fiber lasers 94 and the integration/collimation of the multiple separate pulses 90 by a HOE/DOE integrator or collimator and integrator 92 into a single output pulse 94 having the desired uniform profile.

It will be noted that FIGS. 7A through 7D illustrate the present invention for a bundle of three lasers and stacks or pulse sequences comprised of three laser output pulses. It will be appreciated that this limitation to three lasers is for exemplary purposes only, for reasons of clarity and to avoid a too cluttered figure, and that the invention may be implemented for virtually unlimited numbers of lasers in a bundle and for virtually any sequence of pulses and stacks. It will also be appreciated that in a fiber laser of the present invention that includes a plurality of component fiber laser, such as found in a bundle of component fiber lasers as described in the following discussions, the laser or laser system will also include control circuitry, not shown in the following figures for simplicity and clarity of presentation, for controlling the timing and firing of the component fiber lasers and thus the relative timing between the outputs generated by the component fiber lasers.

FIGS. 7C, 7D and 7E, in turn, illustrate exemplary methods and apparatus of the present invention for generating tacks of pulses from a bundled, or Gattling gun configuration of fiber lasers. As illustrated therein, the bundle 92 is comprised of a plurality of fiber lasers 92, each of which generates an output pulse 90 when pumped, so that the bundle 92 generates a sequence of output pulses at times determined by the pumping times of the individual fiber lasers 92 so that multiple output pulses 90 are generated at separate, sequential times by a bundle 92 of fiber lasers 94 with each pulse 90 being directed along one of a plurality of parallel separated axes 94A, that is, the axes of the individual fiber lasers 94. The pulses 90 are then redirected along a single axis 96 by an optical element 98, so that the pulses 90 appear sequentially in time along that single axis. The spacing of pulses 90 in time along axis 96 is determined by the intervals between the firings of the individual fiber lasers, so that by appropriate selection of the relative firing times of the fiber lasers and the repetition period of each individual laser the pulses 90 can be arranged in time according to a desired stack pulse stack repetition rate, or interval, Ps, and a desired pulse repetition rate, or interval, Pr. As indicated in FIGS. 7C, 7D and 7E, the optical element 98 may be comprised, for example, of a rotating wedge optical system appropriately synchronized with the firing of the fiber lasers, dual acoustical/optical modulators, or a commercially available laser director, such as a Digilens™.

E. Laser Systems Providing Continuous Wave, Pseudo-Continuous Wave and Pulsed Outputs According to the present invention as discussed below, a multi-mode non-excimer UV (ultra-violet) or Visible or IR (infra-red) (188 nm to 4000 nm range) fiber laser that can simultaneously produce both a continuous wave (CW) output beam or a pseudo continuous wave (PCW) output beam as well as pulsed output beam will provide an enhanced process for micro/nano-machining.

In general, the method described below is directed to generating an output laser beam for micro-/nano-machining from a non-excimer laser, such as a non-diode pumped Nd:YAG, Nd:YLF, Nd:YAP or Nd:YVO$_4$ solid state laser operating at a repetition rate >1 kHz, high powered laser having a range of operational wavelengths from 180 nm to 4000 nm or from a diode pumped fiber laser is selected from a group of rare earth doped fiber laser materials, (core materials: SiO$_2$, Aluminosilicate, Phosphate glass, Glass, GeO$_2$, etc), Using dopants comprised of rare earth materials such as Erbium (Er), Er/La, Ytterbium (Yb), Tm, Tm—Ho, Samarium, Er—Yb, Neodymium (Nd), Terbium-Ytterbium, and others.

Such as laser is advantageous for processes such as drilling microvias into multiple layered materials of differing materials, including alternating metal films and dielectric films, or dicing semiconductor materials having single and multiple layers of varying chemical composition, such as silicon and gallium arsenide wafers and ceramic hybrid devices. According to the present intention, such a multi-mode fiber laser can, by applying intense pulses and subsequent alternating CW or PCW laser output beams, achieve a higher throughput than that is possible with standard UV DPSS lasers conventionally employed in microvia drilling or dicing processes for multi-layered printed circuit board materials.

The improved performance of such multi-mode fiber lasers is due in part to the improved beam propagation factor, M2=1, as well as the ability of fiber lasers to be operated in either a pulsed, continuous wave (CW) and pseudo continuous wave (PCW) mode. Fiber lasers can also produce an enhanced linearly polarized beams at wavelength ranges that cannot be achieved by standard UV DPSS lasers, such as in the wavelength range of approximately 387 nm to approximately 290 nm. In addition, and further according to the present invention, such fiber lasers can produce a true Gaussian TEM00 beam mode with an M2=1 (beam propagation value) that allows a greater capability to focus at the diffraction limit. This allows the fiber laser to be imaged to smaller spot sizes than traditional UV DPSS lasers.

According to the present invention, laser drilling or dicing of a multi-layered printed circuit board or of semiconductor wafer materials or of other organic or inorganic substrates is accomplished using optical imaging methods by applying CW, PSW and Pulsed outputs from a fiber laser or lasers, either simultaneously or in sequences of combinations of CW, PSW and Pulsed outputs, at a wavelengths between 160 nm to 4000 nm or at eye safe wavelengths. For example, a fiber laser can produce intense pulsed packets of pulses, using the stacking and combining methods and apparatus described above, and such outputs can provide 2× to 10× the throughput over existing DPSS lasers. For example, the integration of multiple fiber laser outputs as described above allows the outputs of the fiber lasers to be sequenced into a collinear beam with stacked pulse packets at rates of 1 kHz to >500 khz. By comparison, UV DPSS lasers are limited to 100 kHz operation for ablation based processes.

The stacking of pulses and the combining of stacked pulses with continuous beam outputs in turn produces super intense stacked pulses with integral CW sequences that are advantageous for penetrating specific materials that require CW beams for increased laser processing rates. For example, the combination of stacked pulses with a CW output may provide an output beam having a pulse duration <300 ns with a beam propagation factor of M2=<1.1 and preferably M2=1.0. With a CW, PCW or Pulsed output generated by a diode pumped fiber laser (DPFL).

According to the present invention, and as illustrated below, the above methods may be implemented with fiber lasers constructed to provide one or more fiber outputs, such as a plurality of fiber lasers driving a single fiber or a plurality of fiber lasers arranged in, for example, a hexagonal or other type of array of parallel fibers, may be employed in single beam or multiple beam parallel processing of targeted materials. For example, a fiber laser having one or more fiber outputs may be used to illuminate beam shaping and forming elements that concentrate, direct, move, trepan and/or shape the single or multiple beams into a single collinear beam with specific beam intensity patterns, intensity profiles or shapes optimized for laser materials interactions. As described, the concentrated single or multiple output beams of the lasers can be simultaneously or individually or sequentially pulsed or run in CW mode, or any combination thereof, to create an integrated packet of stacked pulses, or stacked pulses with CW packets with specific time durations. The beam shaping and forming elements may in turn include, for example, diffractive, electro optical, acoustic-optical or holographic optical elements or combinations of such elements or a hybrid optical beam delivery system comprised of DOE, EO, HOE, AO and/or traditional geometric optics.

Stated generally, and according to the present invention, the fiber lasers for use in such systems as described above may be implemented by a fiber laser assembly that incorporates a single or multiple fiber lasers to produce an output formed of single or individual beams which have individually variable output beam parameters. The individual beams can be generated by an array of individual fiber lasers that are pumped appropriately for the desired output beam parameters, with the outputs of the individual fiber lasers being combined into a single fiber laser output beam by means of appropriate elements, such as has been described above with reference to FIGS. 7A-7W. In an alternative implementation, the outputs of an array of multiple fiber lasers may be combined into a single fiber laser output by Y-junctioning the individual fibers into a single final fiber that delivers the final fiber laser output beam. Stated another way, this alternative method combines the outputs of the individual fiber lasers into a single output fiber rather than combining the outputs of the individual pumping elements to form a single pump input into a fiber optic.

In yet another alternative implementation, each of the pulses created can be generated from one of a corresponding number of individual pump sources which are Y-connected or merged, using traditional fiber optic pumping schemes, to pump a single fiber optic that operates as the fiber laser, such as has also been described herein above with reference to FIGS. 3A-3D.

As described, fiber lasers constructed according to the present invention as discussed above and as illustrated below, can generate CW, PCW, pulses and stacked pulse outputs independently, simultaneously, sequentially or in any combination thereof by appropriate control and timing of the pumping elements driving the fiber laser or lasers. In addition, a fiber laser component generating certain of the pulses appearing in the fiber laser output, or the fiber laser itself, may incorporate a harmonic generation module or modules to transform the fundamental wavelength generated by the fiber laser, into wavelengths in the visible to UV ranges, such as harmonic crystals PPKTP, BBO or other traditional crystal technology for harmonic generation.

Referring to FIG. 8, therein is shown a diagrammatic representation of a generalized laser beam delivery system 100 of the present invention for micro-/nano-machining of a target 92 and, in particular, a multi-layer target 92, that is mounted on a positioning stage 94. As illustrated, the system 10 includes a fiber laser 96 of the present invention, which will be described in further detail in the following descriptions, which generates a multi-mode beam output 98 comprised of any of CW, PCW and pulse outputs and stacked pulse outputs, the individual outputs comprising the final outputs being generates independently, simultaneously, sequentially or in any combination thereof. For this reason, the beam output or outputs 102 of the fiber laser 96 or of component fiber lasers 96C may passed through a pulse stacking module 104 to form the basic beam output 106, although the specific form taken by pulse stacking module 102 will be dependent upon the specific configuration and arrangement of fiber laser 96 or the component fiber lasers 96C comprising fiber laser 96. As shown, the output 106 of laser 96 may then be passed through a harmonics module 108 to frequency transform the beam output 106 if necessary. The beam output 106 is then passed through beam delivery optics 110, which will include beam shaping optics 112, and then through focusing optics 114, which will project the final shaped and focused beam 106 onto the target 92.

Next considering the construction of the fiber laser 96 in further detail, according to the present invention, and as described briefly above, a fiber laser 96 may be in a number of ways. For example, FIGS. 9A, 9B and 9C illustrate a fiber laser 96 constructed as an array of parallel fiber lasers 96C, wherein FIG. 9A shows an array of 4 fiber lasers 96C, FIG. 9B an array of six fiber lasers 96C and FIG. 9C a plurality of fiber lasers 96C arranged in a circular, circumferential array. It will be understood that the laser beam outputs of the fiber lasers 96C of the fiber lasers 96 shown in FIGS. 9A, 9B and 9C may be combined into a single output beam using a number of methods, such as those shown in FIGS. 7C, 7D and 7E.

Figures 10A, 10B:
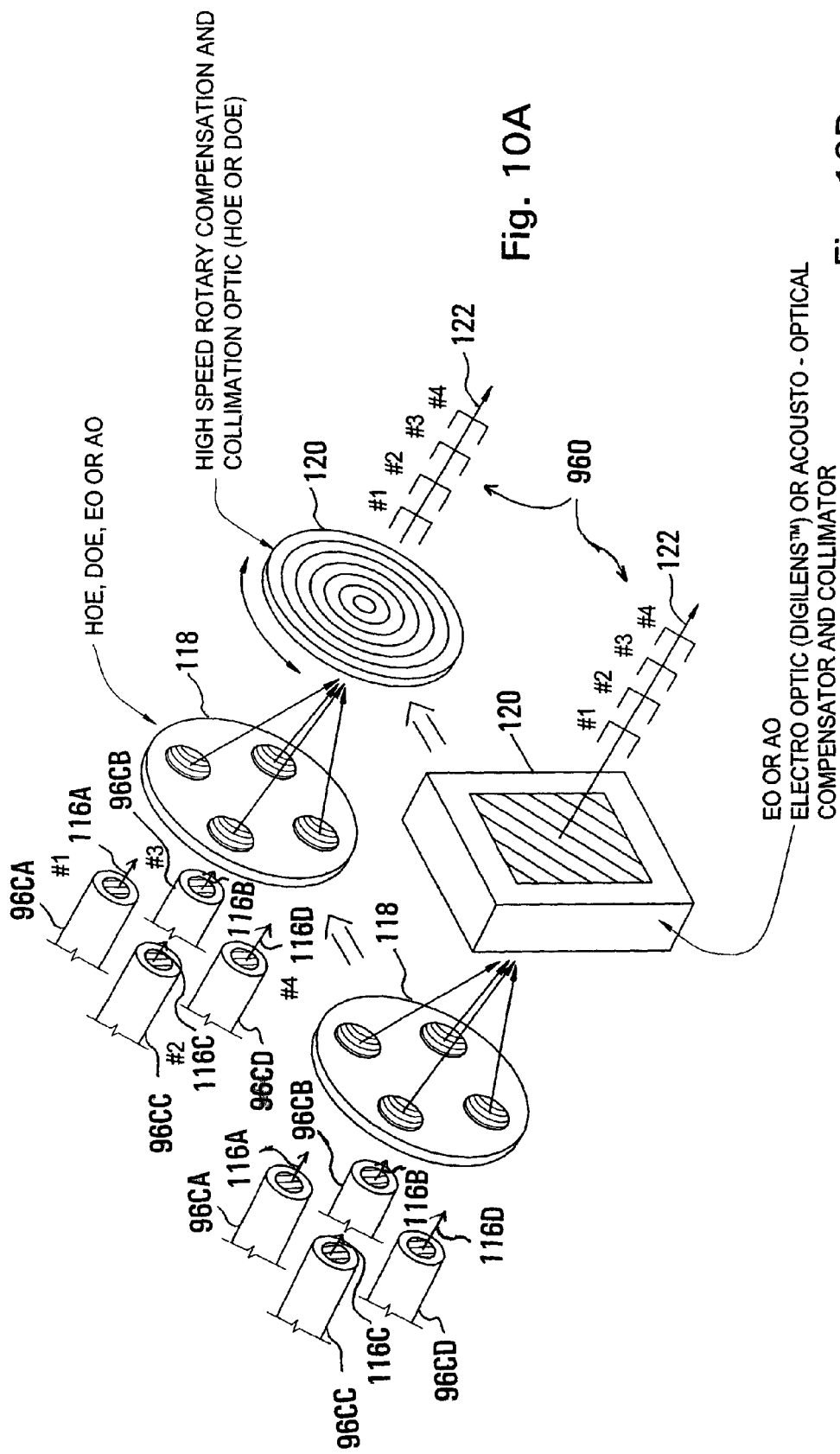
FIGS. 10A, 10B and 11 are diagrammatic representations of a fiber laser beam delivery system employing a fiber laser comprised of bundled component fiber lasers and optical elements for combining the component laser outputs into a single output.

FIGS. 10A and 10B show further methods and apparatus for combining the beam from an array of fiber lasers 96C into a single beam output 96O of a fiber laser 96, using the case of a fiber laser 96 comprised of four component fiber lasers 96C as an example; it will be understood, however, that the fiber laser 96 array may be comprised of virtually any number of component fiber lasers 96C. In FIG. 1A, for example, the parallel but radially separated output beams 112 of component fiber lasers 96CA, 96CB, 96CC and 96CD, designated as beams 116A, 116B, 116C and 112D, are redirected by an optical element 118 to a single input point or area of an alignment optical component 120 and are therein redirected along a single output axis 122, which is the output axis of the fiber laser 96. As represented, the output beams 116A-116D of component fiber lasers 96C may be comprised of sequences of pulses of variable or common width, so that the output of the fiber laser 96 is comprised of a stream of pulses that may be arranged into, for example, stacks of pulses as described herein above. It should also be noted that in FIG. 10A the alignment optical component 120 is comprised, for example, of a high speed rotating compensation and collation optic, and that in FIG. 10B the alignment optical component 120 is comprised, for example, of an AOE (acousto-optical element) or DOE (diffractive optical element).

Figure 11:
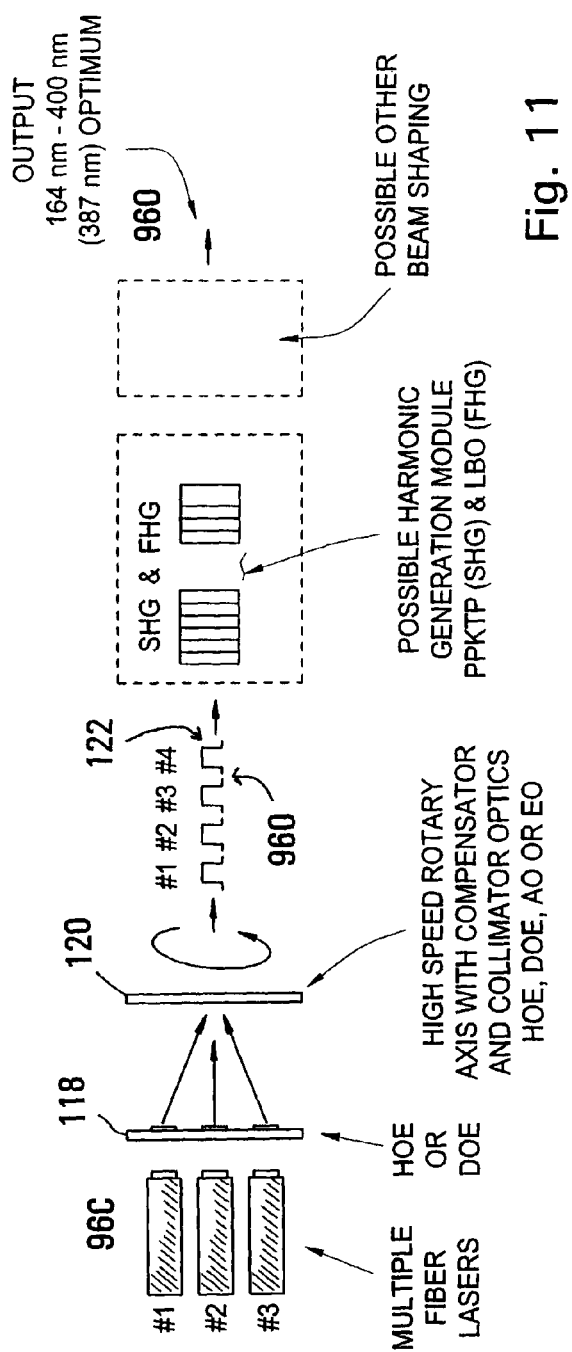
Figure 12:
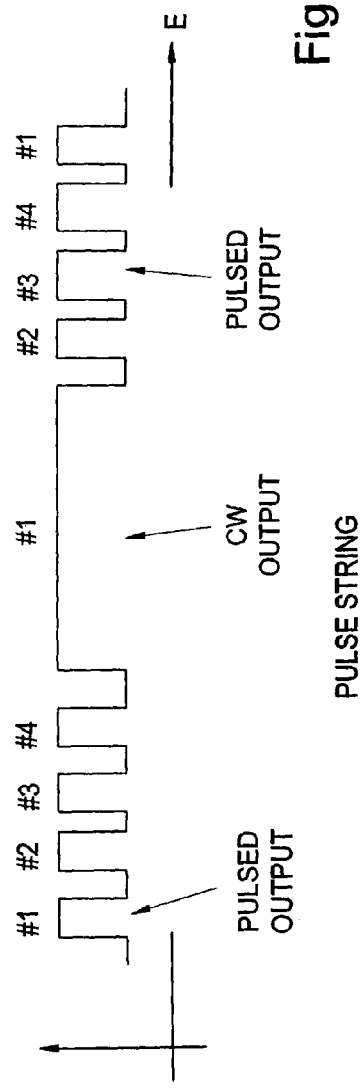
FIG. 12 is a representation of a multiple pulse and continuous wave output generated by a fiber laser system comprised of component fiber lasers.

Referring now to FIGS. 11 and 12, FIG. 11 is a further view of an implementation of a fiber laser 96C according to the present invention, and is similar to the implementations illustrated in FIGS. 10A and 10B. As illustrated therein, the parallel but radially separated pulsed beam outputs 96CA-96Cn of multiple component fiber lasers 96C are redirected by an HOE or DOE optical element 118 to a single input point or area of an alignment optical component 120, shown in this implementation as a high speed rotary compensator and collimator, where they are redirected along a single output axis 122 as fiber laser 96 output 96O. As indicated by the numbering of component fiber lasers 96C, that is, #1, #2, and so on, and by the numbering of the corresponding pulses in fiber laser output 96O, the pulses comprising fiber laser output 96O appear in the time sequence in which they are generated by their corresponding component fiber lasers 96C.

Again, component fiber lasers 96C may be operated in any of the CW, PCW or pulsed modes and their respectively outputs can be combined independently, simultaneously, sequentially or in any combination thereof into any desired fiber laser output sequence of CW, or PCW or pulse or stacked pulse outputs by appropriate control and timing of the pumping elements, that is, component fiber lasers 96C, forming the fiber laser 96. This capability is illustrated in FIG. 11 for one exemplary fiber laser output 96O wherein four component fiber lasers 96C are fired and mode changed in a timing sequence designed to generate a fiber laser output 96O comprised of a sequence of four pulses from component fiber lasers 96C fired in the sequence #1, #2, #3 and #4, followed by one period in which component fiber laser 96C #1 is again fired, but this time in the CW mode to generate a CW output having a significantly longer period than the pulse outputs, which is followed by a sequence of four pulses from component fiber lasers 96C fired in the sequence #2, #3, #4 and #1, component fiber laser 96C #1 having been switched back to the pulse mode after generating the CW output component of the fiber laser output 96O.

Figure 13:
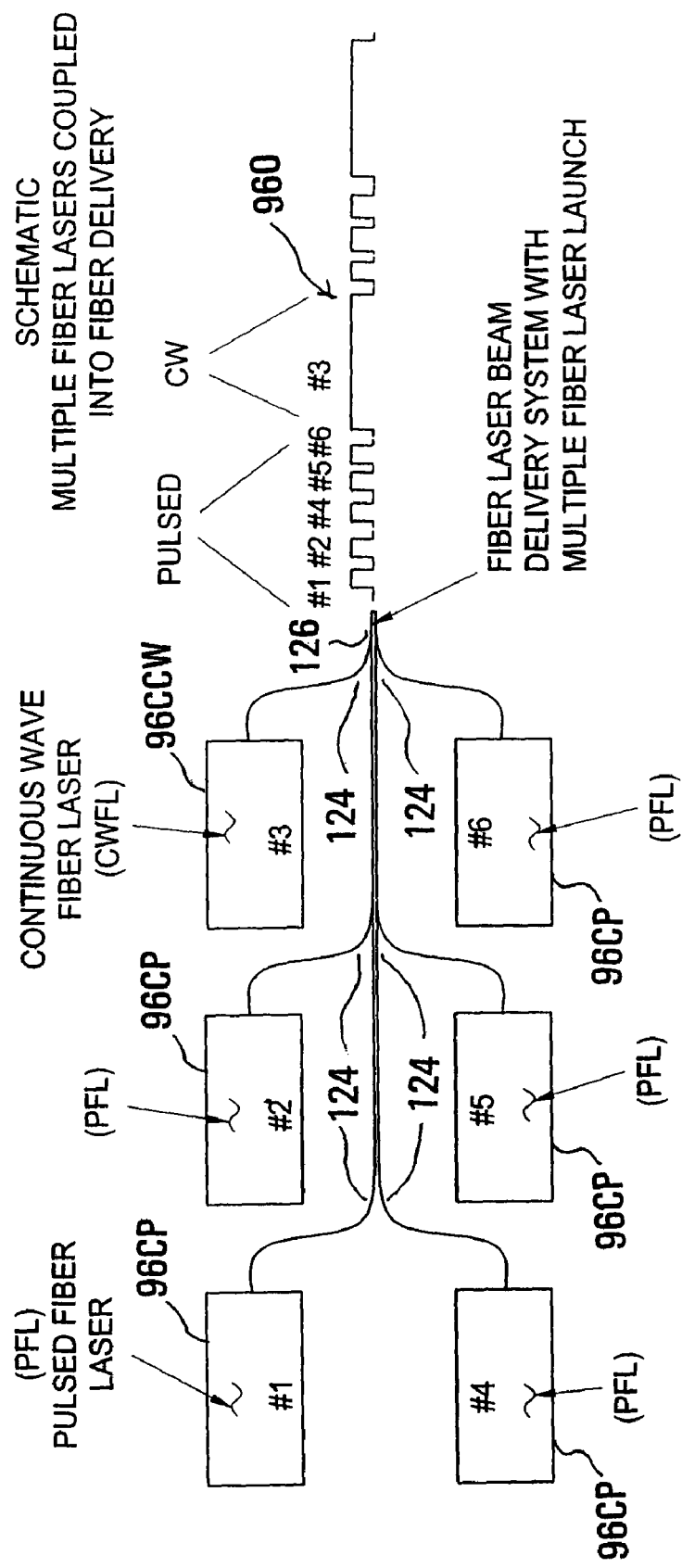
FIG. 13 is a diagrammatic representation of an alternate embodiment of a fiber laser beam delivery system employing a fiber laser comprised of bundled component fiber lasers and optical elements for combining the component laser outputs into a single output.

FIG. 13, in turn, illustrates an alternate construction of a fiber laser 96 for generating an output 96O, using the same fiber laser output 96O as in FIGS. 11 and 12 for purposes of comparative illustration. As shown therein, the fiber laser 96 includes a plurality of component fiber lasers 96C wherein, in this implementation, component fi fiber lasers 96C are comprised of a plurality of pulsed fiber lasers 96CP, designated as component fiber lasers 96C #s 1, 2, 4, 5 and 6, and a single CW component fiber laser 96CCW, designated as component fiber laser 96C #3. The outputs of component fiber lasers 96C are Y-junctioned, by junctions 124 into a single delivery fiber optic component 126, so that the outputs of component fiber lasers 96C appear as a single fiber laser output 96O from the output of the delivery fiber optic component 126. As illustrated, the pulsed component fiber lasers 96CP and the CW component fiber laser 96CCW are fired with the appropriate timing so that the pulsed component fiber lasers 96CP generate the pulse components of the fiber laser output 96O and the CW component fiber laser 96CCW generates the CW component of the fiber laser output 96P in the desired sequence and at the desired times.

Figure 14:
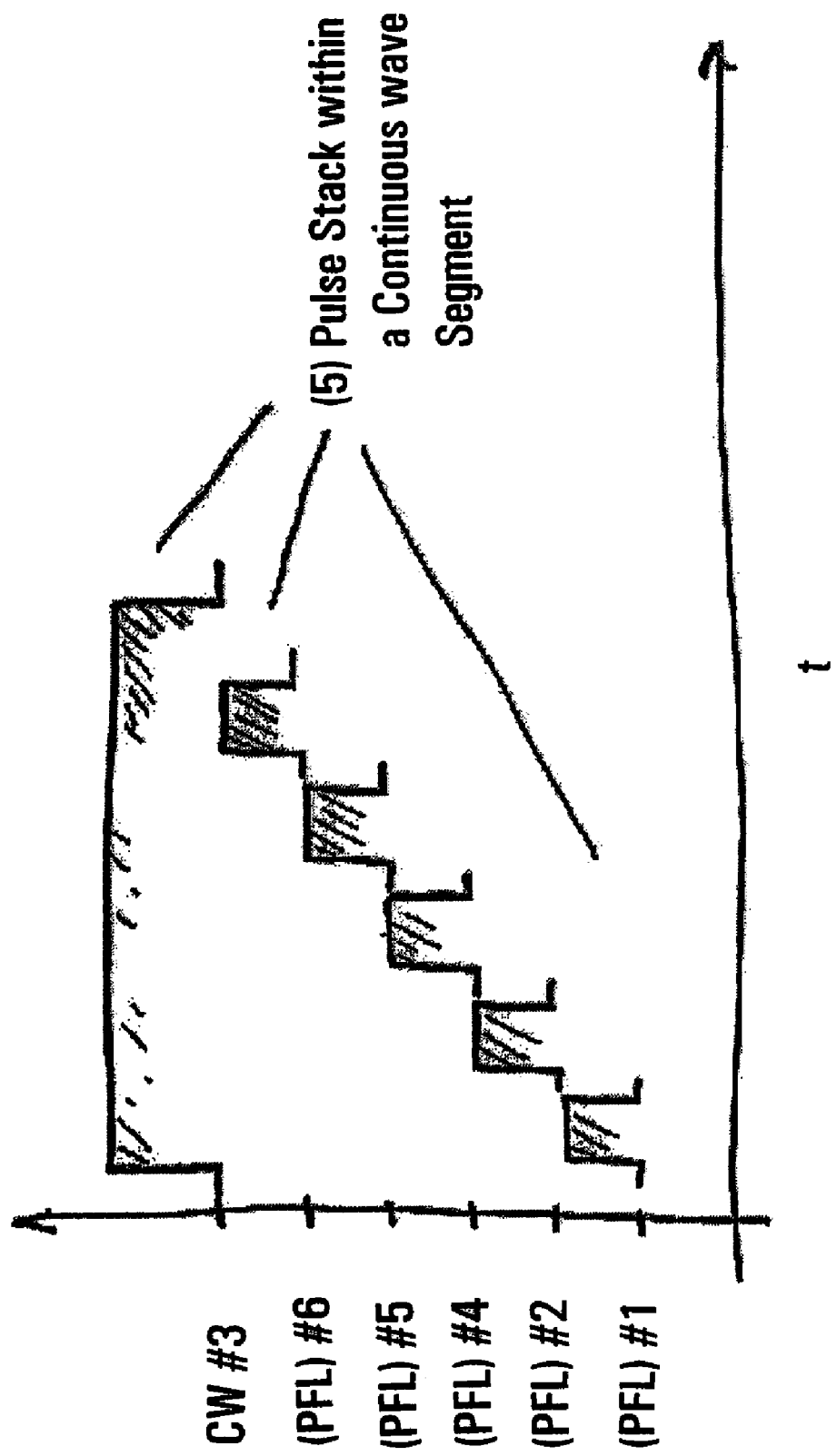
FIG. 14 is a representation of an alternate method for generating a continuous wave pulse output as a stacked pulse output.

FIG. 14 illustrates an alternate method for generating the CW pulse component such as illustrated in the fiber laser output 96O discussed above with reference to FIGS. 11, 12 and 13, but wherein the fiber laser 96 is constructed solely of pulsed component fiber lasers 96CP. In this method, the individual pulsed component fiber lasers 96CP are fired in adjacent time sequence so that the individual pulse outputs of sequential pulsed component fiber lasers 96CP do not overlap in time but so that there is no time interval, or no more than an insignificant time interval, between the end of the output pulse of one pulsed component fiber laser 96CP and the start of the output pulse of the next sequential pulsed component fiber laser 96CP. In effect, therefore, the method illustrated in FIG. 14 generates a CW output as a stack of pulses having effectively zero time interval between the sequential pulses of the stack.

Figure 15:
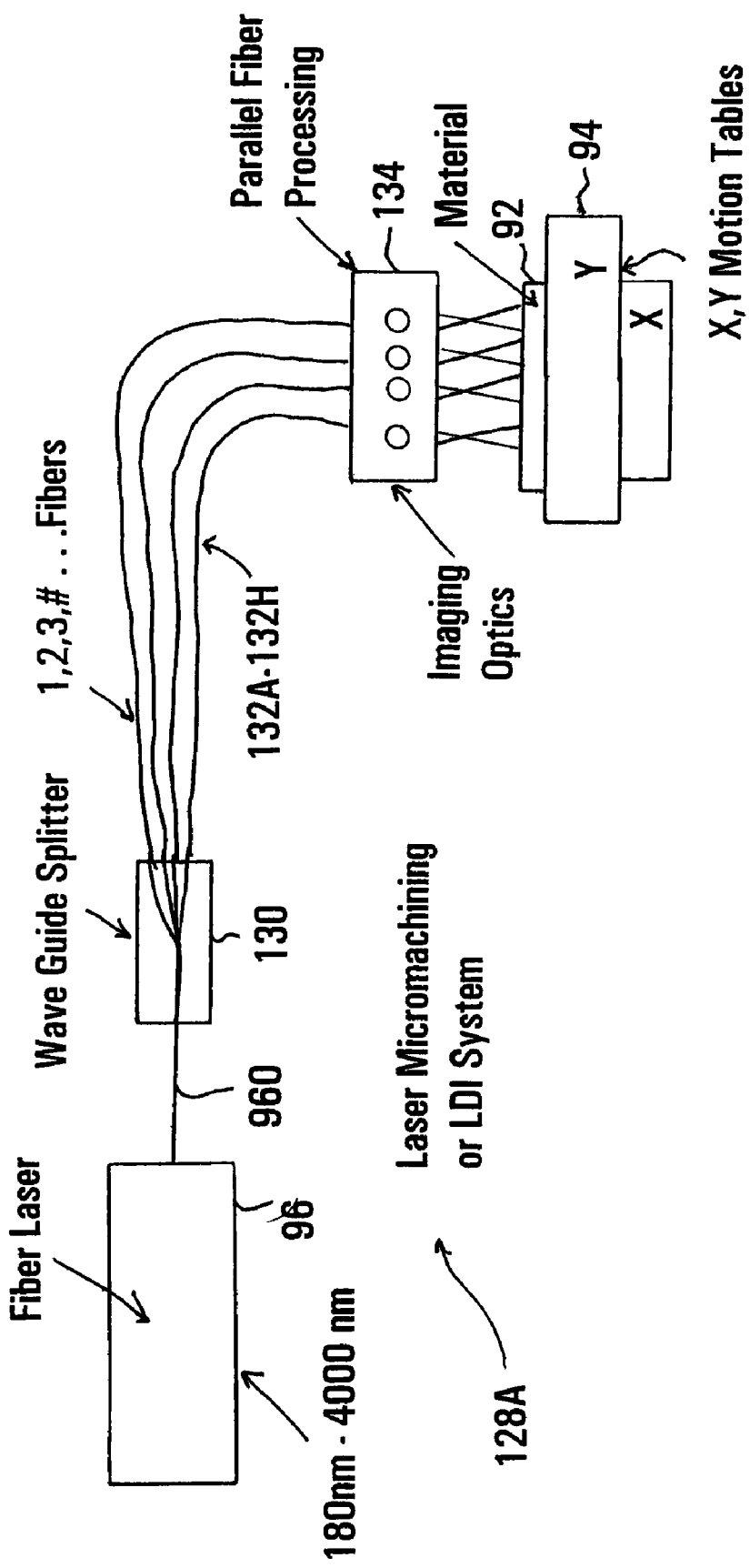
FIGS. 15 and 16A are diagrammatic representations of fiber laser micro-/nano machining systems.

Next considering the use of fiver lasers 96 of the present invention in micro-/nano-machining systems, FIGS. 15, 16A, 16B, 16C and 16D are diagrammatic illustrations of a laser beam delivery system 128A employing a fiber laser 96 of the present invention. FIG. 15 illustrates a system 128 wherein the fiber laser output 96O of a fiber laser 96 are passed through a waveguide splitter 130 that generates multiple corresponding splitter beam outputs 130O, each of which is provided as an input to one of a plurality of optic fibers 132A-132n. Optic fibers 132 carry the beam outputs 130O to a parallel fiber processor 134 that includes imaging optics for each of the optic fibers 132A-132n, that is, for each of the splitter beam outputs 130O, and which directs the focused and imaged splitter beam outputs 130O onto a target workpiece 92 that is typically mounted on an X,Y positioner 94.

Figure 16A:
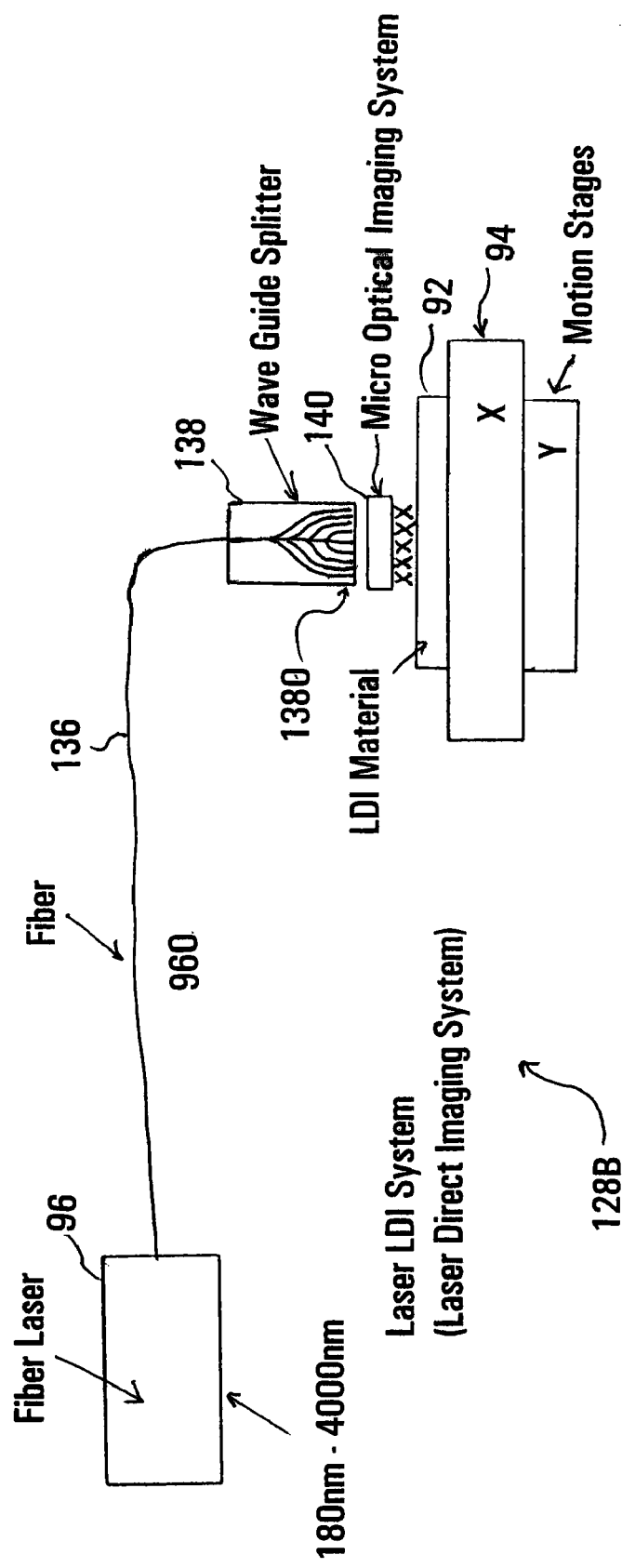

FIG. 16A illustrates a comparable beam delivery system 128B, except that in this implementation the fiber laser output 96O of the fiber laser 96 is carried through a single fiber optic 136 to the imaging components of the system 128B, whereupon the laser output 96O is divided into a plurality of beam outputs 138O by a waveguide splitter 138. The beam outputs 138O are then passed through a micro-optical imaging system 140 to be focused and imaged onto the target workpiece 92.

FIG. 16B then illustrates the fiber optic 136, waveguide splitter 138 and micro-optical imaging system 138 of the system 128 in further detail. FIG. 16C illustrates an embodiment of either system 128A or system 128B wherein either the a plurality of optic fibers 136 of a system 128 that includes a plurality of fiber lasers 96, each driving a single optic fiber 136, or the plurality of optic fibers 132 of a system 128A, drives multiple waveguide splitters 138, each of which may include a micro-optical imaging system 140. As illustrated in FIG. 16C, the waveguide splitters 138 may be arranged in a side by side straight line array or, as illustrated in FIG. 16D, the waveguide splitter 138 may be arranged in a staggered array.

Figure 17A:
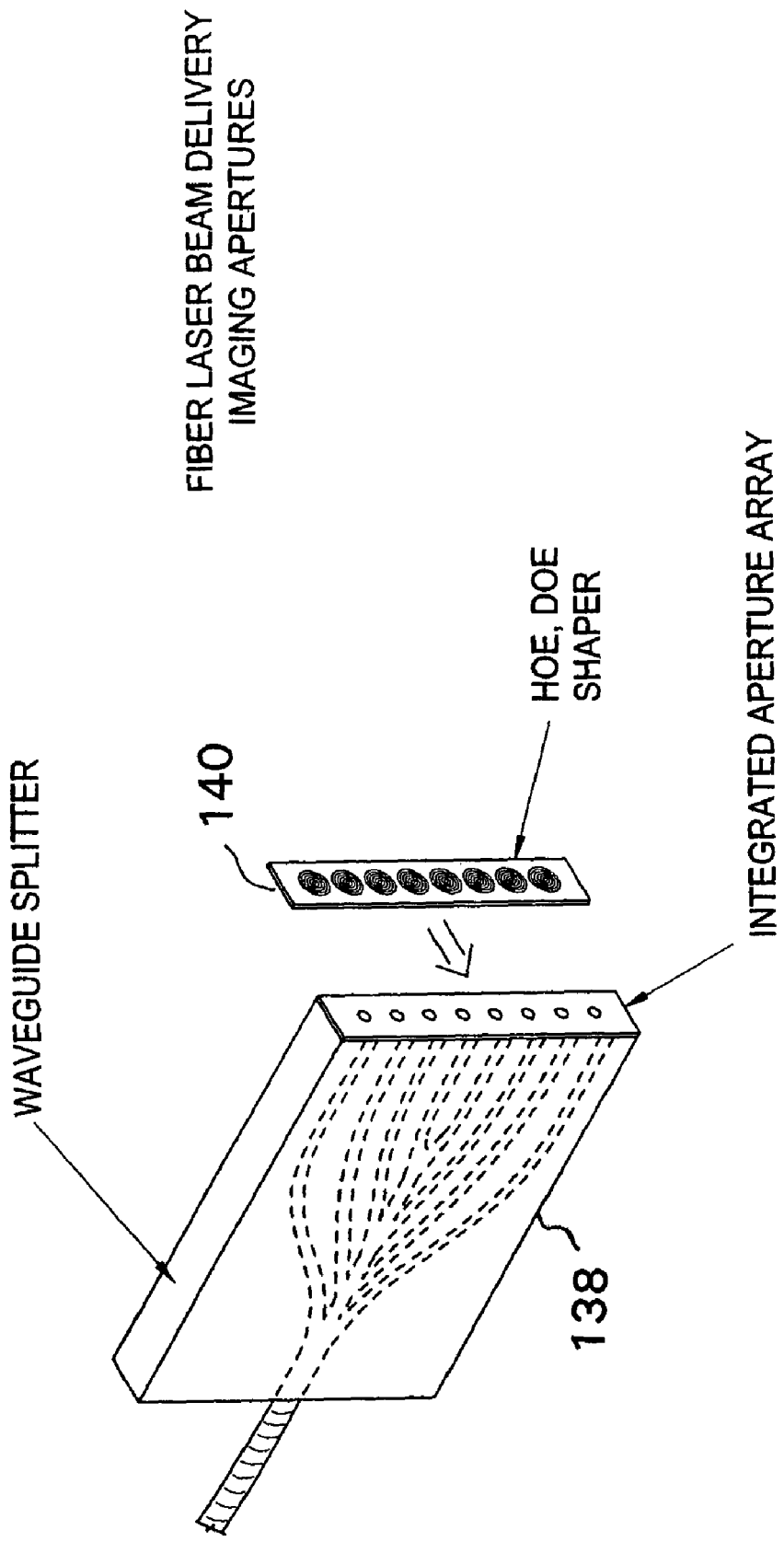
Figure 17B:
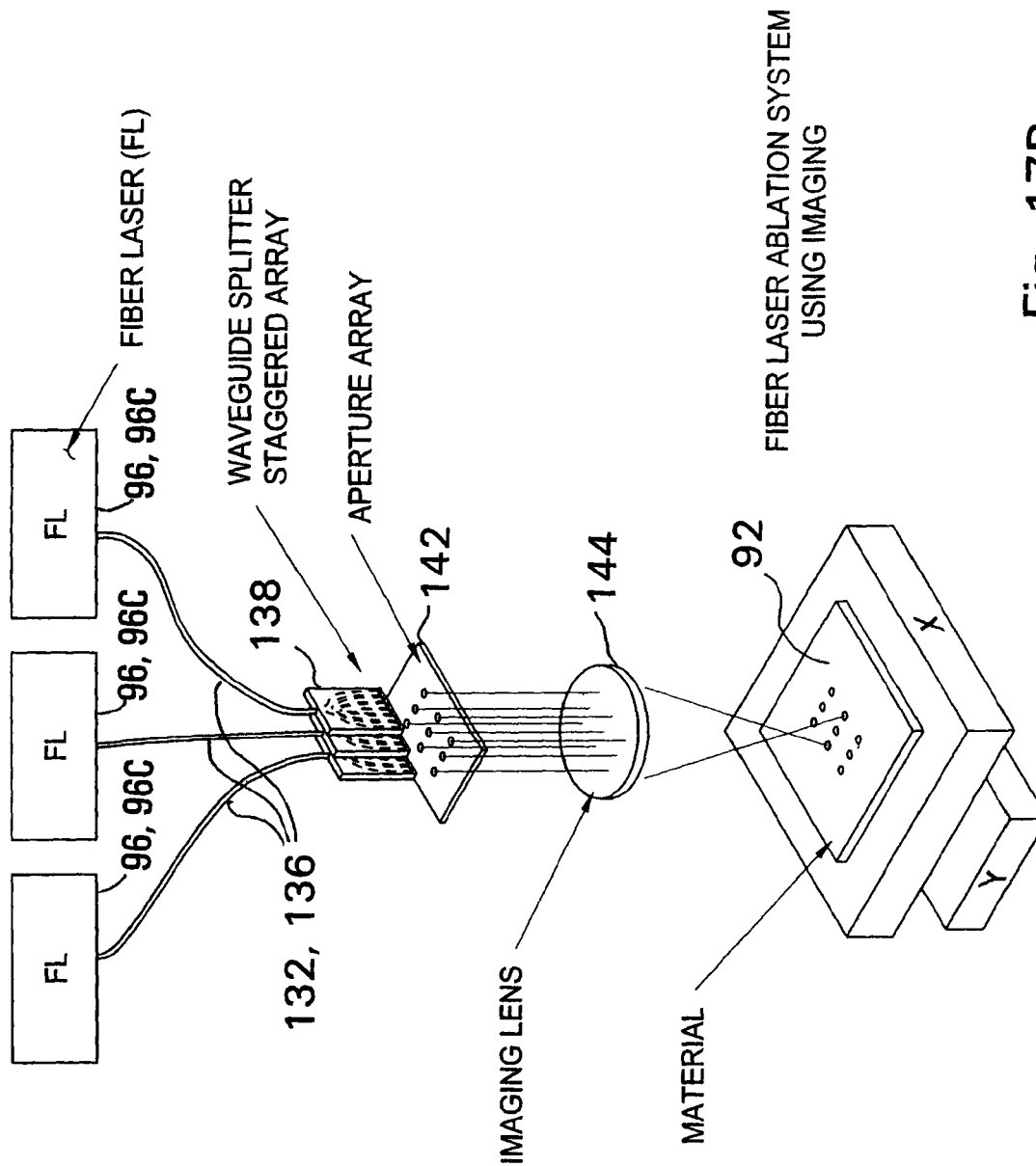

Referring to FIGS. 17A and 17B, as shown in FIG. 17A the micro-optical imaging system 140 may be incorporated or integrated into the waveguide splitter 138 while, as illustrated in FIG. 17B, the functions of the micro-optical imaging system 140 may be performed by an aperture array 142 and imaging lens 144 located between the waveguide splitter 138 or array of waveguide splitters 138 and the target workpiece 92.

Figure 18:
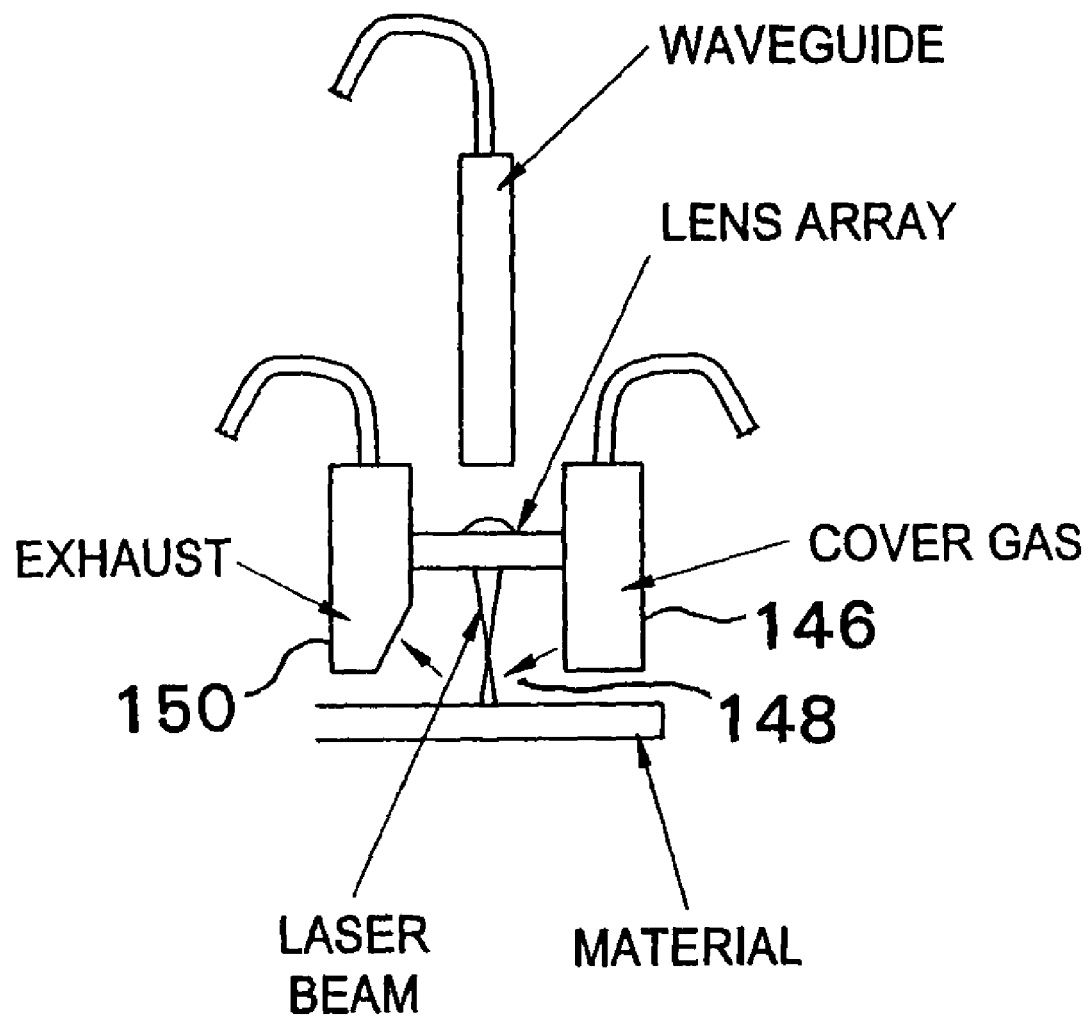

Finally, FIG. 18 illustrates an implementation of the final optic focusing and imaging elements, such as elements 138 and 140 or 138, 142 and 144, further include a cover gas dispensing vent 146 for dispensing a flow of gas 148, such as an inert gas, over the face of the workpiece 92 during micro-/nano-machining operations, and an exhaust vent for 150 for removing the gas 148 from the work area of the workpiece 92.

F. Exemplary Applications and Advantages

Figure 19A:
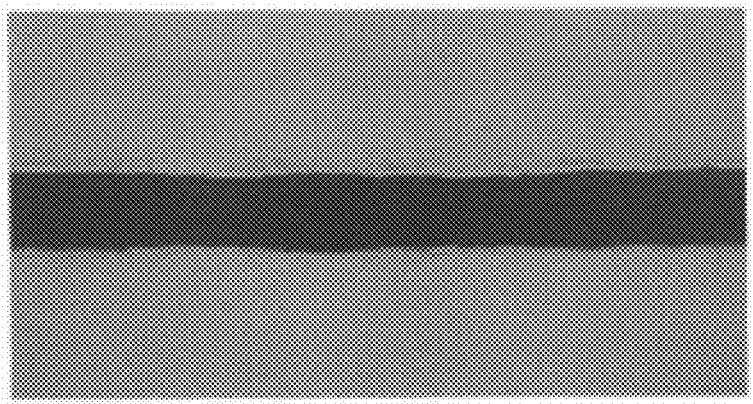
FIGS. 19A, B and C are illustrations of results achieved in the drilling and dicing of silicon by fiber lasers according to the present invention.
Figure 19B:
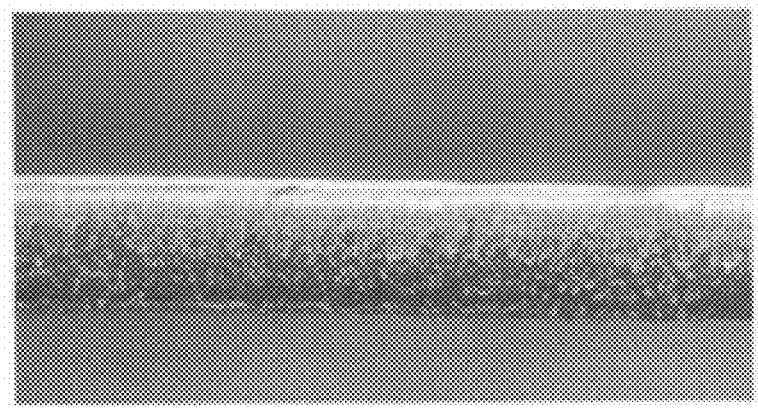
FIGS. 19D, E and F are comparative illustrations of results achieved in the drilling and dicing of silicon by fiber lasers according to the present invention.
Figure 19C:
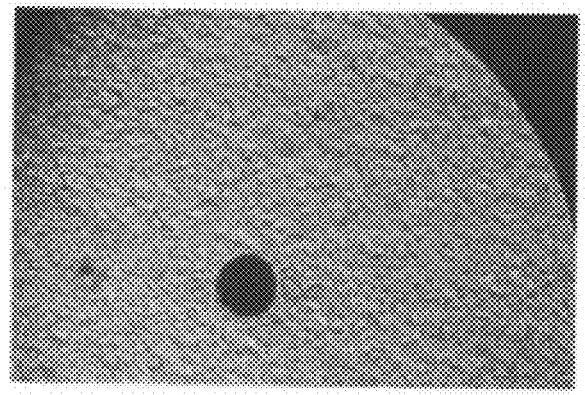
Figure 19F:
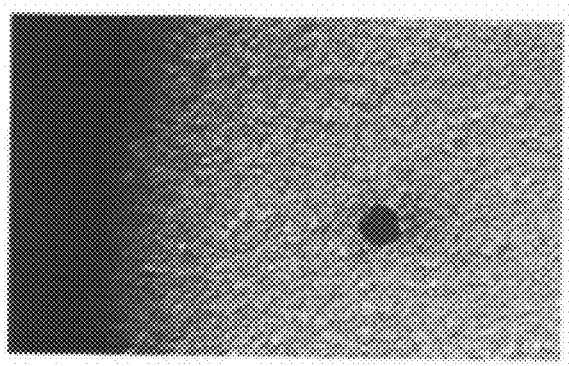
Figure 19D:
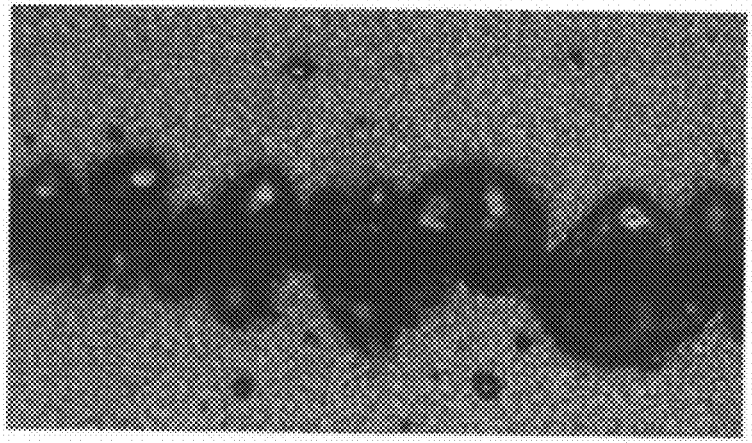
Figure 19E:
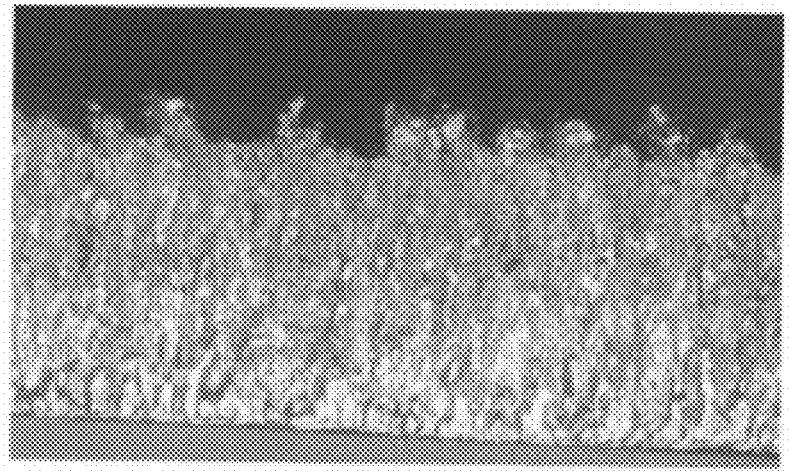
Figure 20A:
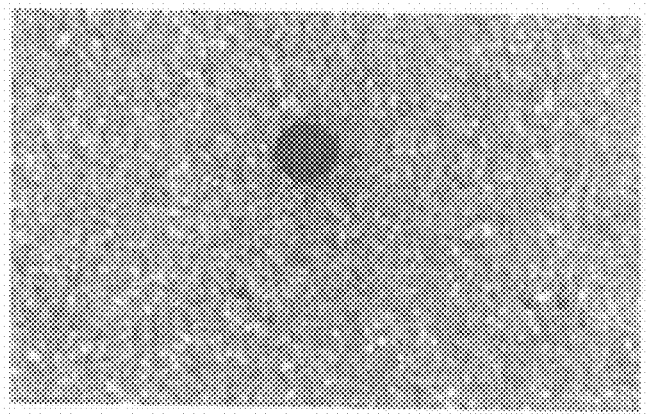
FIGS. 20A and 20B are similar illustrations of results achieve by fiber lasers of the present invention and the systems of the prior art in drilling alumina.
Figure 20B:
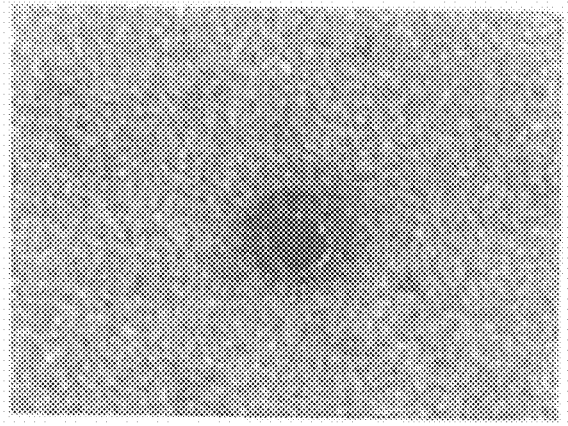

Examples of the results obtained using fiber lasers and fiber laser systems of the present invention for the dicing and drilling of silicon are illustrated FIGS. 19A, B and C which are examples of results achieved in the drilling and dicing of silicon by fiber lasers according to the present invention and may be compared to FIGS. 19D, E and F, which illustrate results achieved in the drilling and dicing of silicon by lasers and laser systems of the prior art. FIGS. 20A and 20B are similar illustrations of results achieve by fiber lasers of the present invention and the systems of the prior art in drilling alumina.

Fiber lasers 96 and fiber laser systems according to the present invention as described herein above permit the construction of fiber lasers in the output wavelength range of UV or Visible or IR (188 nm to 4000 nm range) with a pulsed duration below <400 ns, as well as longer pulse durations >400 ns for applications where intense continuous heat is required and fiber lasers with outputs in the eye-safe wavelength ranges for applications in welding, cutting, milling, dicing and marking of organic and inorganic materials. The use of fiber lasers according to the present invention and with outputs in the visible, IR and UV wavelength range with a beam propagation value of M2=<1.1 or with an optimum beam propagation value of M2=1.0, is advantageous in applications involving the drilling of orifices or holes and in critical drug delivery medical device applications. In addition, fiber lasers according to the present invention and producing eye-safe wavelength outputs are advantageous for the removal of organic and inorganic coatings on electrical wires, multilayered circuit boards and wafers.

Fiber lasers according to the present invention and generating continuous wave and pulsed lasers within the same collinear beam delivery system, either by use of a fiber beam delivery or an optical integrator as described, are also advantageous laser plastics welding systems. Such systems allow a laser plastic welding system to produce both tack welds and continuous plastic welds on the fly and the use of fiber lasers generating outputs in eye-safe wavelengths of ~1300 nm for welding plastics and other materials also provide the capability of operating with woven and non-woven textiles and synthetic materials.

Fiber lasers implemented according to the present invention and generating continuous wave and pulsed outputs within the same collinear beam delivery system in the wavelength range of 180 nm to 4000 nm are also useful for such operations as dicing silicon wafers or other semiconductor wafers. These systems and processes may advantageously employ the M2=1 output beam to produce diffraction limited imaged spots to cleanly cut both organic and inorganic wafer materials. In addition, the process produces an energy density >0.3 j/cm2 to cut through both thin films and thick wafers and, with a beam propagation value of M2=1, the laser can be imaged or focused into a spot size that allows for high aspect ratio drilling or dicing.

The use of continuous wave and pulsed lasers within the same collinear beam delivery system as described herein above may also be employed in a laser imaging system that performs a single or two photon process or ablative process for forming two dimensional and three dimensional structures in photo activated polymers (stereo-lithography), thermally activated polymers or other materials, sintering metals or ceramics, or compounds with photo-sensitive binders and other photo-sensitive materials or crystal and glass materials to form micro and nano structures, such as photonic crystals or larger items such as plastic or sintered prototypes parts by means of wavelengths between 180 nm to 4000 nm range. The use of continuous and pulsed outputs as described herein above provides the capability to produce smaller features on the structures formed by the fiber laser process. The ability to achieve a beam propagation value of M2=<1.1 allows a smaller diffraction limited spot that is not possible with UV ion and UV DPSS lasers for applications involving thermal sintering or photo polymerization of sintering material with integrated photo-sensitive binders.

The continuous wave and pulsed lasers within the same collinear beam delivery, either by use of a fiber beam delivery or an optical integrator as described herein above may be employed in a laser imaging system that performs a single or two photon or ablative process for forming two dimensional and three dimensional structures in photo activated polymers or photo-resist materials used to form circuit patterns in printed circuit boards. The use of continuous and pulsed output provides the opportunity to produce smaller features on the structures formed by the fiber laser process. The ability to achieve a beam propagation value of M2=<1.1 allows a smaller diffraction limited spot that is not possible with UV ion, other non-excimer and UV DPSS lasers for application involving laser direct imaging of photo resist materials and other photo sensitive or thermally sensitive materials for forming masks for etching printed circuit board materials or chip packaging products. The process can also produce direct ablation of the materials to form the mask without secondary development of the mask materials.

The continuous wave and pulsed lasers within the same collinear beam delivery, either by use of a fiber beam delivery or an optical integrator as described herein above may also be employed in a laser imaging system that performs a single or two photon or ablative process for forming micro or nano sized structures in organic and inorganic, single layer and multilayer materials of varying chemical composition and variable density. The ability to achieve a beam propagation value of M2=<1.1 allows a smaller diffraction limited spot than is possible with UV ion, other non-excimer and UV DPSS lasers for applications involving the patterning of thin and thick film materials used for display devices, medical diagnostic devices and other devices where micro or nano machined structures are required.

Since certain changes may be made in the above described invention without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, we claim:

1. A multi-pumped fiber laser, comprising:
   an optical fiber,
   a first end structure, including
      a first optical path including a first beam splitter for coupling an output of a first pump laser to the first end of the optical fiber to drive the optical fiber,
      a second optical path including the first beam splitter for coupling the first end of the optical fiber to an optical reflecting element assembly to form a first reflecting end of the resonant optical cavity, and
      a first vortex lens located between the first end of the optical fiber and the first and second optical paths for shaping an energy profile the output of the first pump laser into the fiber laser to have a region of reduced power in the central regions of the beam enemy profile of the output of the first pump laser, and
   a second end structure, including
      a third optical path including a second beam splitter for coupling an output of a second pump laser to a second end of the optical fiber to drive the optical fiber,
      a fourth optical path including the second beam splitter for coupling the second end of the optical fiber to a second optical reflecting element assembly to form a second reflecting end of the resonant optical cavity,
      a second vortex lens located between the second end of the optical fiber and the third and fourth optical paths for shaping an energy profile of the output of the second pump laser into the fiber laser to have a region of reduced power in the central regions of the output of the second pump laser, and
   an output path, including
      a third beam splitter located in the fourth optical path for coupling an output from the second end of the optical fiber passing through the fourth optical path to a beam output of the fiber laser.

2. The multi-pumped fiber laser of claim 1, wherein:
   the output path further includes a harmonic generation module for wavelength transformation of the output of the optic fiber and a vortex lens element for shaping the energy profile of the beam output of the fiber laser to have a region of reduce power in the central regions of the beam energy profile, wherein
   the vortex lens is located at one of an input of the harmonic generation module and an output of the harmonic generation module.

* * * * *